(12) United States Patent
Prasad et al.

(10) Patent No.: US 11,765,815 B2
(45) Date of Patent: Sep. 19, 2023

(54) PRINTED CIRCUIT BOARD BASED SOLID STATE RELAY

(71) Applicant: GM GLOBAL TECHNOLOGY OPERATIONS LLC, Detroit, MI (US)

(72) Inventors: Rashmi Prasad, Troy, MI (US); Chandra S. Namuduri, Troy, MI (US); Muhammad H. Alvi, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 233 days.

(21) Appl. No.: 17/132,242

(22) Filed: Dec. 23, 2020

(65) Prior Publication Data
US 2022/0201845 A1    Jun. 23, 2022

(51) Int. Cl.
| H05K 1/14 | (2006.01) |
| H05K 1/02 | (2006.01) |
| H05K 1/18 | (2006.01) |
| H02P 27/06 | (2006.01) |

(52) U.S. Cl.
CPC .......... *H05K 1/0257* (2013.01); *H02P 27/06* (2013.01); *H05K 1/14* (2013.01); *H05K 1/181* (2013.01); *H05K 2201/10053* (2013.01); *H05K 2201/10151* (2013.01); *H05K 2201/10166* (2013.01); *H05K 2201/10174* (2013.01); *H05K 2201/10272* (2013.01)

(58) Field of Classification Search
CPC .......... H05K 1/02; H05K 1/0257; H05K 1/14; H05K 1/141–144; H05K 1/18; H05K 1/181–187; H01L 23/00; H01L 23/07; H01L 23/31; H01L 23/498; H02M 1/00

USPC .......... 361/775–784, 813; 439/76.2
See application file for complete search history.

(56) References Cited

U.S. PATENT DOCUMENTS

| 6,212,087 | B1 * | 4/2001 | Grant | H05K 7/1432 361/715 |
|---|---|---|---|---|
| 7,522,405 | B2 * | 4/2009 | Fogleman | H03K 17/122 257/107 |
| 10,369,896 | B2 | 8/2019 | Namuduri et al. | |
| 10,432,130 | B2 | 10/2019 | Namuduri et al. | |
| 10,665,398 | B1 | 5/2020 | Namuduri et al. | |
| 10,675,991 | B2 | 6/2020 | Hu et al. | |
| 2015/0371937 | A1 * | 12/2015 | Yoshihara | H01L 23/49822 361/761 |
| 2016/0172995 | A1 * | 6/2016 | Obiraki | H01L 25/072 361/728 |
| 2017/0187371 | A1 * | 6/2017 | Fabregas | H03K 17/687 |
| 2018/0206359 | A1 * | 7/2018 | McPherson | H01L 25/072 |

(Continued)

OTHER PUBLICATIONS

U.S. Appl. No. 16/570,227, filed Sep. 13, 2019, Prasad et al.

(Continued)

*Primary Examiner* — Tuan T Dinh

(57) ABSTRACT

A bi-directional solid state switch includes: a first bus bar; a second bus bar; a first solid state switch implemented on a first printed circuit board (PCB), the first solid state switch including: a first control terminal; a first terminal electrically connected to the first bus bar; and a second terminal; and a second solid state switch implemented on a second PCB, the second solid state switch including: a second control terminal; a third terminal electrically connected to the second terminal of the first solid state switch; and a fourth terminal electrically connected to the second bus bar.

19 Claims, 21 Drawing Sheets

(56) References Cited

U.S. PATENT DOCUMENTS

2019/0221952 A1* 7/2019 Hagiwara ............ H01R 12/718
2019/0320549 A1* 10/2019 Song ................. H05K 7/14329
2019/0372063 A1* 12/2019 Xu ...................... H01M 50/147
2021/0407954 A1* 12/2021 Yoshihara ............... H01L 24/48

OTHER PUBLICATIONS

U.S. Appl. No. 16/656,084, filed Oct. 17, 2019, Namuduri et al.
U.S. Appl. No. 16/677,065, filed Nov. 7, 2019, Namuduri et al.
U.S. Appl. No. 16/819,872, filed Mar. 16, 2020, Namuduri et al.
U.S. Appl. No. 16/915,296, filed Jun. 29, 2020, Prasad et al.
U.S. Appl. No. 17/122,388, filed Dec. 15, 2020, Namuduri et al.

* cited by examiner

PRINTED CIRCUIT BOARD BASED SOLID STATE RELAY

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to switches and more particularly to solid state relays implemented on printed circuit. Some types of vehicles include only an internal combustion engine that generates propulsion torque. Electric vehicles may not include an internal combustion engine and may rely on one or more electric motors for propulsion.

Hybrid vehicles include both an internal combustion engine and one or more electric motors. Some types of hybrid vehicles utilize the electric motor and the internal combustion engine in an effort to achieve greater fuel efficiency than if only the internal combustion engine was used. Some types of hybrid vehicles utilize the electric motor and the internal combustion engine to achieve greater torque output than the internal combustion could achieve by itself.

Some example types of hybrid vehicles include parallel hybrid vehicles, series hybrid vehicles, and other types of hybrid vehicles. In a parallel hybrid vehicle, the electric motor works in parallel with the engine to combine power and range advantages of the engine with efficiency and regenerative braking advantages of electric motors. In a series hybrid vehicle, the engine drives a generator to produce electricity for the electric motor, and the electric motor drives a transmission. This allows the electric motor to assume some of the power responsibilities of the engine, which may permit the use of a smaller and possibly more efficient engine.

SUMMARY

In a feature, a bi-directional solid state switch includes: a first bus bar; a second bus bar; a first solid state switch implemented on a first printed circuit board (PCB), the first solid state switch including: a first control terminal; a first terminal electrically connected to the first bus bar; and a second terminal; and a second solid state switch implemented on a second PCB, the second solid state switch including: a second control terminal; a third terminal electrically connected to the second terminal of the first solid state switch; and a fourth terminal electrically connected to the second bus bar.

In further features, the first PCB and the second PCB are the both part of one PCB.

In further features, the first and second solid state switches are electrically connected via the one PCB.

In further features, the first and second PCBs are different PCBs.

In further features, the PCB based bi-directional solid state switch includes a third bus bar, where the third terminal is electrically connected to the second terminal via the third bus bar.

In further features: the first solid state switch is disposed between the first PCB and the first bus bar; and the second solid state switch is disposed between the second PCB and the second bus bar.

In further features, the first PCB is disposed between the first bus bar and the second PCB.

In further features, the second PCB is disposed between the first PCB and the second bus bar.

In further features, the PCB based bi-directional solid state switch includes a driver configured to apply signals to the first and second control terminals and implemented on a third PCB.

In further features, the PCB based bi-directional solid state switch includes: a first diode connected antiparallel to the first solid state switch and implemented on the first PCB; and a second diode connected antiparallel to the second solid state switch and implemented on the second PCB.

In further features, the PCB based bi-directional solid state switch includes a snubber with a first end electrically connected to the first terminal of the first solid state switch and a second end electrically connected to the fourth terminal of the second solid state switch.

In further features, the snubber includes a resistor and a capacitor.

In further features, the PCB based bi-directional solid state switch includes a current sensor on the first bus bar.

In further features, the PCB based bi-directional solid state switch includes: a third solid state switch implemented on the first PCB, the third solid state switch including: a third control terminal; a fifth terminal electrically connected to the first bus bar; and a sixth terminal; and a fourth solid state switch implemented on the second PCB, the fourth solid state switch including: a fourth control terminal; a seventh terminal electrically connected to the sixth terminal of the second solid state switch; and an eighth terminal electrically connected to the second bus bar.

In further features, the PCB based bi-directional solid state switch includes a third bus bar, where the third terminal is electrically connected to the second terminal via the third bus bar, and where the seventh terminal is electrically connected to the sixth terminal via the third bus bar.

In further features, the PCB based bi-directional solid state switch includes a third bus bar having a first segment and a second segment that is separate from the second segment, where the third terminal is electrically connected to the second terminal via the first segment, and where the seventh terminal is electrically connected to the sixth terminal via the second segment.

In further features, the first and second solid state switches are field effect transistors.

In further features, the first and second solid state switches are insulated gate bipolar transistors.

In further features, the first and second solid state switches are metal oxide semiconductor field effect transistors.

In further features, the PCB based bi-directional solid state switch includes a control module configured to: open the second solid state switch when the first solid state switch is closed; and open the first solid state switch when the second solid state switch is closed.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

An inverter module of a vehicle includes legs of switches that regulate current flow (a) from a battery to an electric motor and (b) from the electric motor to the battery. A direct current (DC) bus may be connected between the inverter module and the battery. High voltage electromechanical relays could be used to make and break electrical connection between the battery and the DC bus. Fuses could be used to prevent over current events.

Electromechanical relays, however, are large (e.g., greater than 0.5 kilograms), have slow switching speeds (e.g., greater than 10 milliseconds). Electromechanical relays also rely on moving parts for making/breaking electrical connection. Electromechanical relays may also suffer from contact welding during high current switching, for example, due to contact bounce. Fuses are also relatively large and have slow reaction times (e.g., greater than 5 milliseconds). Fuses are also current and temperature dependent and, once open, require manual replacement.

The present application involves a PCB based bidirectional solid state relay. The bidirectional solid state relay is implemented on one or more PCBs and is configured to block high voltage (e.g., at least 600 volts) and current in both directions. The bidirectional solid state relay is configured to carry a predetermined current (e.g., at least 100 amps) continuously and is scalable such that multiple bidirectional solid state relays can be implemented in parallel on the PCB(s). The bidirectional solid state relay has a low on resistance and has a fast response (e.g., 0.2 milliseconds or less).

Voltage, temperature, and current sensing may also be provided on the PCB based bidirectional solid state relay. A control module may also be provided on the PCB based bidirectional solid state relay. Bus bars may be used as electrical connectors and also as heat spreaders to spread and dissipate heat. The bus bars described herein may be electrical conductors (e.g., bars of electrically conductive material, such as copper or aluminum) or electrically conductive material on a PCB. The PCB based approach may offer scalability while minimizing size and decreasing cost. The PCB based approach also enables the use of non-mechanical components.

Figure 1:
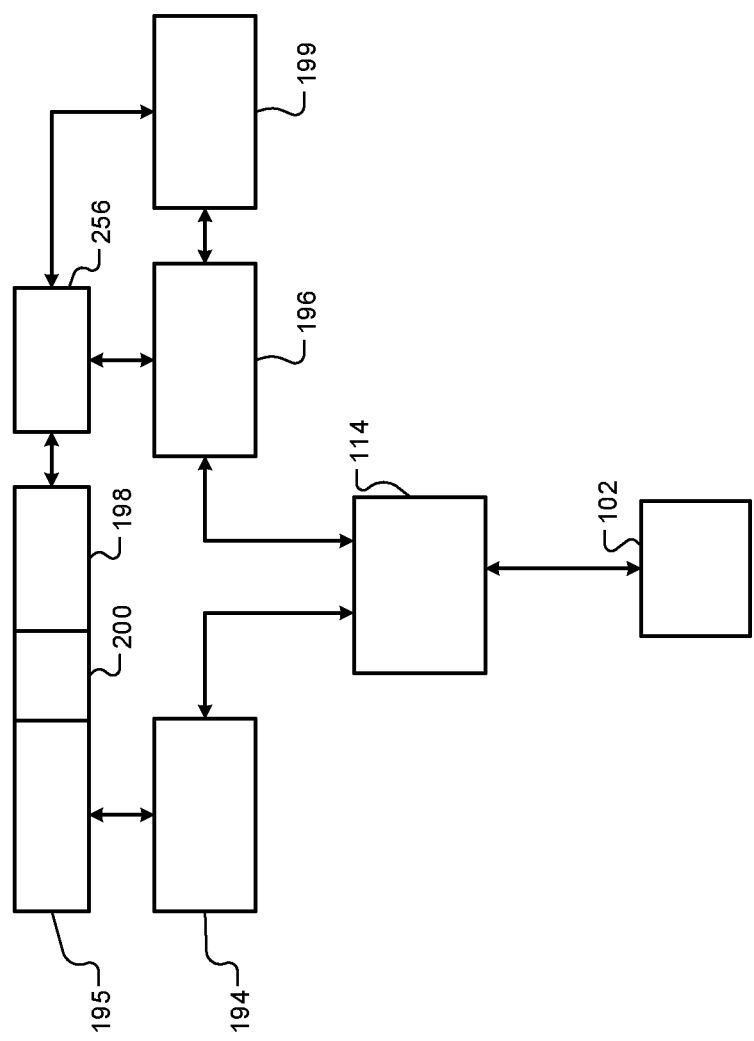
FIG. 1 is a functional block diagram of an example vehicle system.

Referring now to FIG. 1, a functional block diagram of an example vehicle system is presented. While a vehicle system for a hybrid vehicle is shown and will be described, the present disclosure is also applicable to electric vehicles that do not include an internal combustion engine (including pure electric vehicles), fuel cell vehicles, autonomous vehicles, and other types of vehicles. Also, while the example of a vehicle is provided, the present application is also applicable to non-vehicle implementations.

An engine 102 may combust an air/fuel mixture to generate drive torque. An engine control module (ECM) 114 controls the engine 102. For example, the ECM 114 may control actuation of engine actuators, such as a throttle valve, one or more spark plugs, one or more fuel injectors, valve actuators, camshaft phasers, an exhaust gas recirculation (EGR) valve, one or more boost devices, and other suitable engine actuators. In some types of vehicles (e.g., electric vehicles), the engine 102 may be omitted.

The engine 102 may output torque to a transmission 195. A transmission control module (TCM) 194 controls operation of the transmission 195. For example, the TCM 194 may control gear selection within the transmission 195 and one or more torque transfer devices (e.g., a torque converter, one or more clutches, etc.).

The vehicle system includes one or more electric motors, such as electric motor 198. An electric motor can act as either a generator or as a motor at a given time. When acting as a generator, an electric motor converts mechanical energy into electrical energy. The electrical energy can be, for example, used to charge a battery 199. When acting as a motor, an electric motor generates torque that may be used, for example, for vehicle propulsion. While the example of one electric motor is provided, the vehicle may include more than one electric motor.

A motor control module 196 controls power flow from the battery 199 to the electric motor 198 and from the electric motor 198 to the battery 199. The motor control module 196 applies electrical power from the battery 199 to the electric motor 198 to cause the electric motor 198 to output positive torque, such as for vehicle propulsion. The battery 199 may include, for example, one or more batteries and/or battery packs.

The electric motor 198 may output torque, for example, to an input shaft of the transmission 195 or to an output shaft of the transmission 195. A clutch 200 may be engaged to couple the electric motor 198 to the transmission 195 and disengaged to decouple the electric motor 198 from the transmission 195. One or more gearing devices may be implemented between an output of the clutch 200 and an input of the transmission 195 to provide a predetermined ratio between rotation of the electric motor 198 and rotation of the input of the transmission 195.

The motor control module 196 may also selectively convert mechanical energy of the vehicle into electrical energy. More specifically, the electric motor 198 generates and outputs power via back EMF when the electric motor 198 is being driven by the transmission 195 and the motor control module 196 is not applying power to the electric motor 198 from the battery 199. The motor control module 196 may charge the battery 199 via the power output by the electric motor 198.

Figure 2:
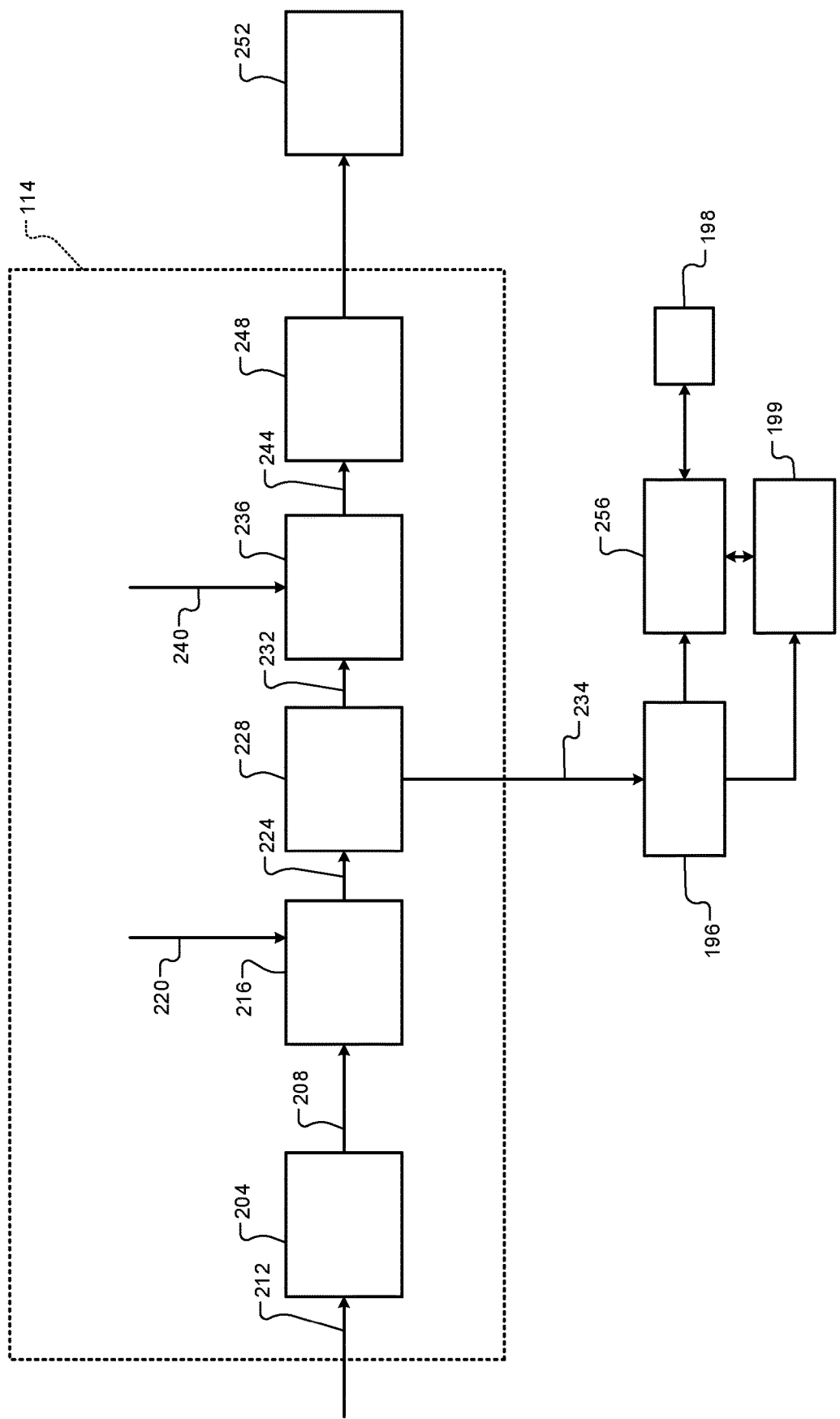
FIG. 2 is a functional block diagram of an example propulsion control system.

Referring now to FIG. 2, a functional block diagram of an example propulsion control system is presented. A driver torque module 204 determines a driver torque request 208 based on driver input 212. The driver input 212 may include, for example, an accelerator pedal position (APP), a brake pedal position (BPP), cruise control input, and/or an autonomous input. In various implementations, the cruise control input may be provided by an adaptive cruise control system that attempts to maintain at least a predetermined distance between the vehicle and objects in a path of the vehicle. The autonomous input may be provided by an autonomous driving system that controls movement of a vehicle from location to location while avoiding objects and other vehicles. The driver torque module 204 determines the driver torque request 208 based on one or more lookup tables that relate the driver inputs to driver torque requests. The APP and BPP may be measured using one or more APP sensors and BPP sensors, respectively.

The driver torque request 208 may be an axle torque request. Axle torques (including axle torque requests) refer to torque at the wheels. As discussed further below, propulsion torques (including propulsion torque requests) are different than axle torques in that propulsion torques may refer to torque at a transmission input shaft.

An axle torque arbitration module 216 arbitrates between the driver torque request 208 and other axle torque requests 220. Axle torque (torque at the wheels) may be produced by various sources including the engine 102 and/or one or more electric motors, such as the electric motor 198. Examples of the other axle torque requests 220 include, but are not limited to, a torque reduction requested by a traction control system when positive wheel slip is detected, a torque increase request to counteract negative wheel slip, brake management requests to reduce axle torque to ensure that the axle torque does not exceed the ability of the brakes to hold the vehicle when the vehicle is stopped, and vehicle overspeed torque requests to reduce the axle torque to prevent the vehicle from exceeding a predetermined speed. The axle torque arbitration module 216 outputs one or more axle torque requests 224 based on the results of arbitrating between the received axle torque requests 208 and 220.

In hybrid vehicles, a hybrid module 228 may determine how much of the one or more axle torque requests 224 should be produced by the engine 102 and how much of the one or more axle torque requests 224 should be produced by the electric motor 198. The example of the electric motor 198 will be continued for simplicity, but multiple electric motors may be used. The hybrid module 228 outputs one or more engine torque requests 232 to a propulsion torque arbitration module 236. The engine torque requests 232 indicate a requested torque output of the engine 102.

The hybrid module 228 also outputs a motor torque request 234 to the motor control module 196. The motor torque request 234 indicates a requested torque output (positive or negative) of the electric motor 198. In vehicles where the engine 102 is omitted (e.g., electric vehicles) or is not connected to output propulsion torque for the vehicle, the axle torque arbitration module 216 may output one axle torque request and the motor torque request 234 may be equal to that axle torque request. In the example of an electric vehicle, the ECM 114 may be omitted, and the driver torque module 204 and the axle torque arbitration module 216 may be implemented within the motor control module 196.

In electric vehicles, the driver torque module 204 may input the driver torque request 208 to the motor control module 196 and the components related to controlling engine actuators may be omitted.

The propulsion torque arbitration module 236 converts the engine torque requests 232 from an axle torque domain (torque at the wheels) into a propulsion torque domain (e.g., torque at an input shaft of the transmission). The propulsion torque arbitration module 236 arbitrates the converted torque requests with other propulsion torque requests 240. Examples of the other propulsion torque requests 240 include, but are not limited to, torque reductions requested for engine over-speed protection and torque increases requested for stall prevention. The propulsion torque arbitration module 236 may output one or more propulsion torque requests 244 as a result of the arbitration.

An actuator control module 248 controls actuators 252 of the engine 102 based on the propulsion torque requests 244. For example, based on the propulsion torque requests 244, the actuator control module 248 may control opening of a throttle valve, timing of spark provided by spark plugs, timing and amount of fuel injected by fuel injectors, cylinder actuation/deactivation, intake and exhaust valve phasing, output of one or more boost devices (e.g., turbochargers, superchargers, etc.), opening of an EGR valve, and/or one or more other engine actuators. In various implementations, the propulsion torque requests 244 may be adjusted or modified before use by the actuator control module 248, such as to create a torque reserve.

The motor control module 196 controls switching of switches of an inverter module 256 based on the motor torque request 234. Switching of the inverter module 256 controls power flow from the battery 199 to the electric motor 198. As such, switching of the inverter module 256 controls torque of the electric motor 198. The inverter module 256 also converts power generated by the electric motor 198 and outputs power to the battery 199, for example, to charge the battery 199.

The inverter module 256 includes a plurality of switches. The motor control module 196 switches the switches to convert DC power from the battery 199 into alternating current (AC) power and to apply the AC power to the electric motor 198 to drive the electric motor 198. For example, the inverter module 256 may convert the DC power from the battery 199 into n-phase AC power and apply the n-phase AC power to (e.g., a, b, and c, or u, v, and w) n stator windings of the electric motor 198. In various implementations, n is equal to 3. Magnetic flux produced via current flow through the stator windings drives a rotor of the electric motor 198. The rotor is connected to and drives rotation of an output shaft of the electric motor 198.

In various implementations, one or more filters may be electrically connected between the inverter module 256 and the battery 199. The one or more filters may be implemented, for example, to filter power flow to and from the battery 199. As an example, a filter including one or more capacitors and resistors may be electrically connected in parallel with the inverter module 256 and the battery 199.

Figure 3:
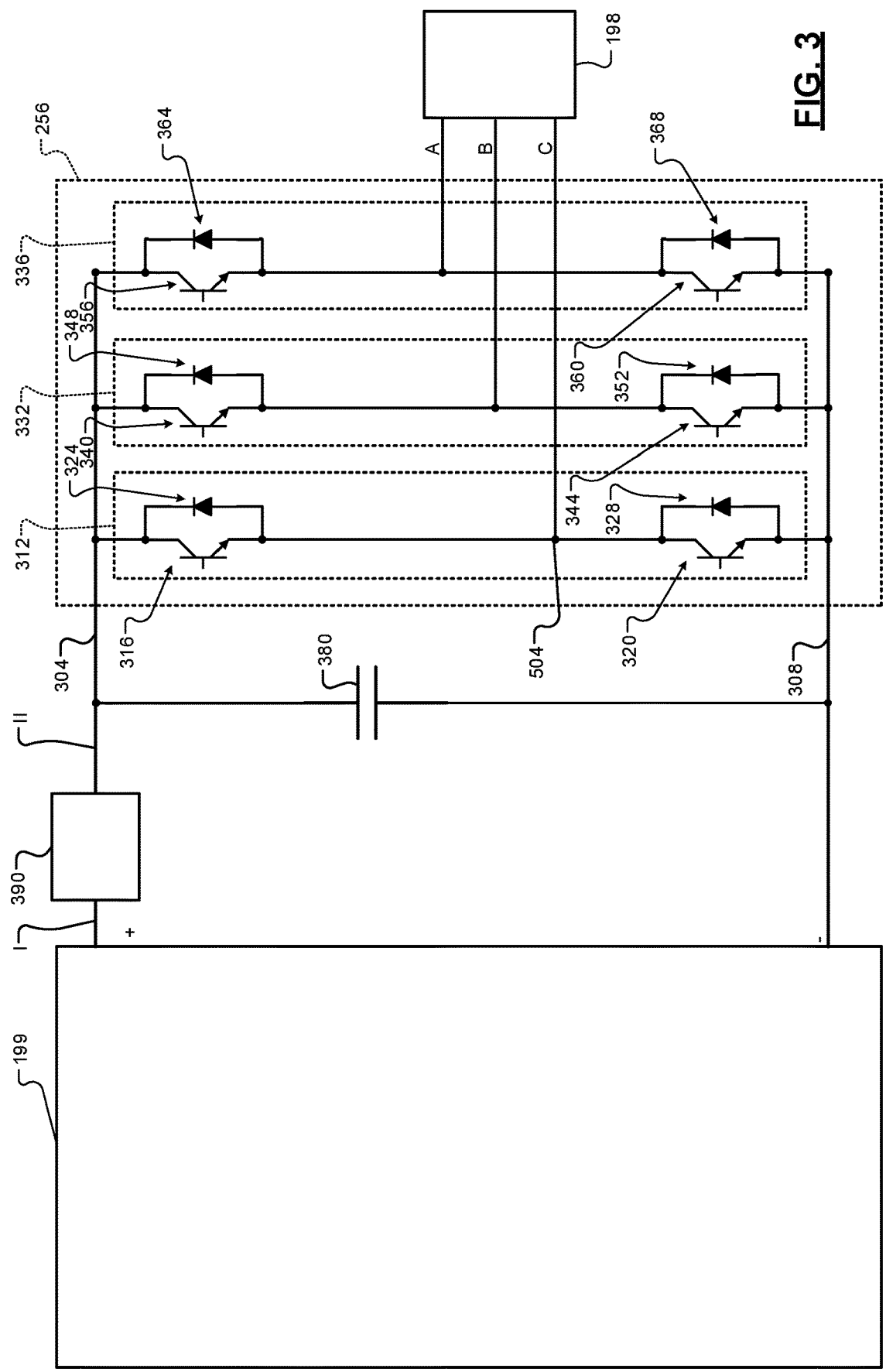
FIG. 3 is a schematic including an example implementation of an inverter module and a battery.

FIG. 3 includes a schematic including an example implementation of the inverter module 256 and the battery 199. The battery 199 may also be referred to as a battery pack. High (positive, DC+) and low (negative, DC−) sides 304 and 308 are connected to positive and negative terminals, respectively, of the battery 199. The inverter module 256 is also connected between the high and low sides 304 and 308.

The inverter module 256 includes three legs, one leg connected to each phase of the electric motor 198. A first leg 312 includes first and second switches 316 and 320. The switches 316 and 320 each include a first terminal, a second terminal, and a control terminal. Each of the switches 316 and 320 may be an insulated gate bipolar transistor (IGBT), a field effect transistor (FET), such as a metal oxide semiconductor FET (MOSFET), or another suitable type of switch. In the example of IGBTs and FETs, the control terminal is referred to as a gate.

The first terminal of the first switch 316 is connected to the high side 304. The second terminal of the first switch 316 is connected to the first terminal of the second switch 320. The second terminal of the second switch 320 may be connected to the low side 308. A node connected to the second terminal of the first switch 316 and the first terminal of the second switch 320 is connected to a first phase (e.g., a) of the electric motor 198.

The first leg 312 also includes first and second diodes 324 and 328 connected anti-parallel to the switches 316 and 320, respectively. In other words, an anode of the first diode 324 is connected to the second terminal of the first switch 316, and a cathode of the first diode 324 is connected to the first terminal of the first switch 316. An anode of the second diode 328 is connected to the second terminal of the second switch 320, and a cathode of the second diode 328 is connected to the first terminal of the second switch 320. When the switches 316 and 320 are off (and open), power generated by the electric motor 198 is transferred through the diodes 324 and 328 when the output voltage of the electric motor 198 is greater than the voltage of the battery 199. This charges the battery 199. The diodes 324 and 328 form one phase of a three-phase rectifier.

The inverter module 256 also includes second and third legs 332 and 336. The second and third legs 332 and 336 may be (circuitry wise) similar or identical to the first leg 312. In other words, the second and third legs 332 and 336 may each include respective switches and diodes like the switches 316 and 320 and the diodes 324 and 328, connected in the same manner as the first leg 312. For example, the second leg 332 includes switches 340 and 344 and anti-parallel diodes 348 and 352. A node connected to the second terminal of the switch 340 and the first terminal of the switch 344 is connected to a second stator winding (e.g., b) of the electric motor 198. The third leg 336 includes switches 356 and 360 and anti-parallel diodes 364 and 368. A node connected to the second terminal of the switch 356 and the first terminal of the switch 360 is connected to a third stator winding (e.g., c) of the electric motor 198.

As shown in FIG. 3, a PCB based solid state bidirectional switch 390 may be connected between the battery 199 and the capacitor 380, such as in the high side 304. While an example location of the switch 390 is provided, the switch 390 may be connected in the low side 308. In various implementations, one switch like the switch 390 may be connected in each of the high and low sides 304 and 308. Also, the present application is also applicable to the switch 390 being implemented elsewhere and in other environments.

Figure 4:
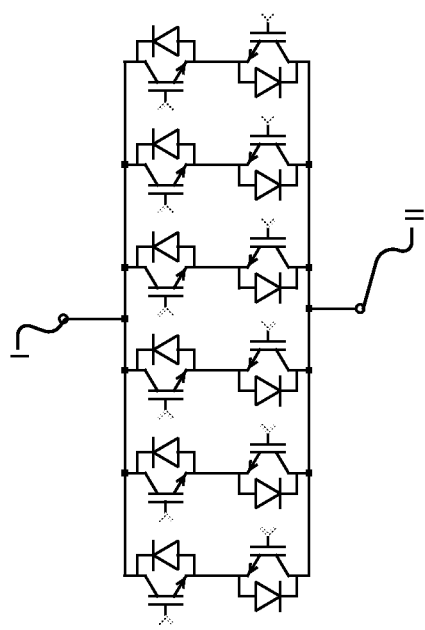
FIG. 4 is an example schematic of six legs of switches of a PCB based solid state bidirectional switch assembly.

FIG. 4 is an example schematic of six legs of switches of the solid state bidirectional switch 390. Six legs of switches may be provided, for example, such that approximately one/sixth of current to and from the battery flows through each leg. Generally speaking, the solid state bidirectional switch 390 may include N legs of switches where N is an integer greater than or equal to 1. Current flow through each of the legs may be approximately equal to 1/N. Each switch and antiparallel diode may be implemented in a die. The dies are implemented on one or more printed circuit boards (PCBs), as discussed further below. Each leg includes two switches (e.g., one p-type and one n-type) and antiparallel diodes.

Figure 5:
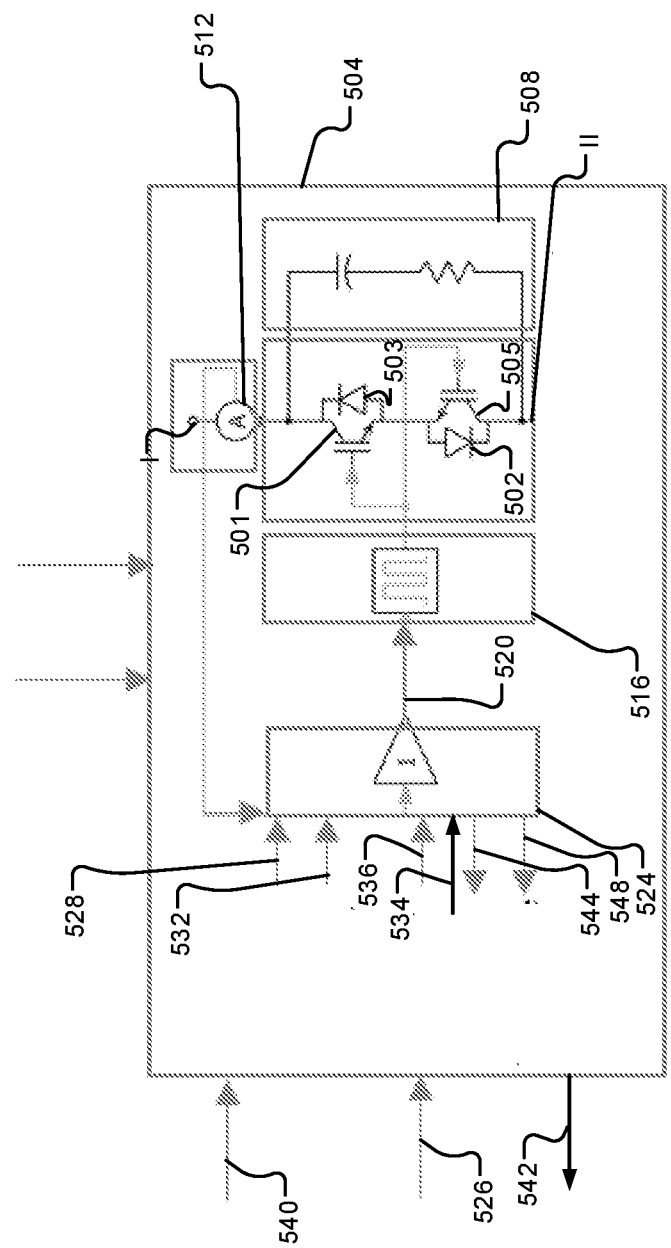
FIG. 5 is a functional block diagram of an example implementation of the PCB based solid state bidirectional switch.

FIG. 5 is a functional block diagram of an example implementation of a portion of a PCB 504 of the solid state bidirectional switch 390. Switches 501 and 502 along with diodes 503 and 505 form a solid state bidirectional switch, which is implemented on the PCB 504. A snubber 508 is also implemented on the PCB 504. The snubber 508 may include a resistor and a capacitor as shown across the solid state bidirectional switch.

A current sensor 512 measures current through the leg. A gate driver 516 opens and closes of the switches 501 and 502 based on a signal 520 from a microcontroller 524 or control module. For example, the gate driver 516 may apply a signal having a first state to the gates of the switches 501 and 502 when the signal 520 is in a first state and apply the signal having a second state to the gates of the switches 501 and 502 when the signal 520 is in a second state. Generally, one of the switches 501 and 502 is open when the other one of the switches 501 and 502 is closed. One of the switches 501 and 502 may be a first type of switch (e.g., p-type) and the other one of the switches 501 and 502 may be a second type of switch (e.g., n-type) such that the signal 520 causes the switches 501 and 502 to be in the opposite (complementary) open/closed states.

The microcontroller 524 generates the signal 520 based on various inputs (control signals) 526, such as a pulse width command 528, a ramp rate 532, a precharge input 534, and a reset input 536. The microcontroller 524 may open and close the switches 501 and 502 of each leg to precharge the capacitor 380 (e.g., with increasing duty cycle) when the precharge input 534 is received. This may limit inrush current and charge the capacitor 380.

Power 540 is received from a power source, such as a 12 volt DC power source. The microcontroller 524 outputs output signals 542, such as a fault (status) signal 544 and a temperature signal 548. The microcontroller 524 may generate the fault signal 544 to indicate whether the solid state bidirectional switch has a fault or not. The temperature signal 548 may indicate a temperature of the solid state bidirectional switch. The microcontroller 524 may measure the temperature of the solid state bidirectional switch. The microcontroller 524 may also measure a voltage across the solid state bidirectional switch.

Figure 6:
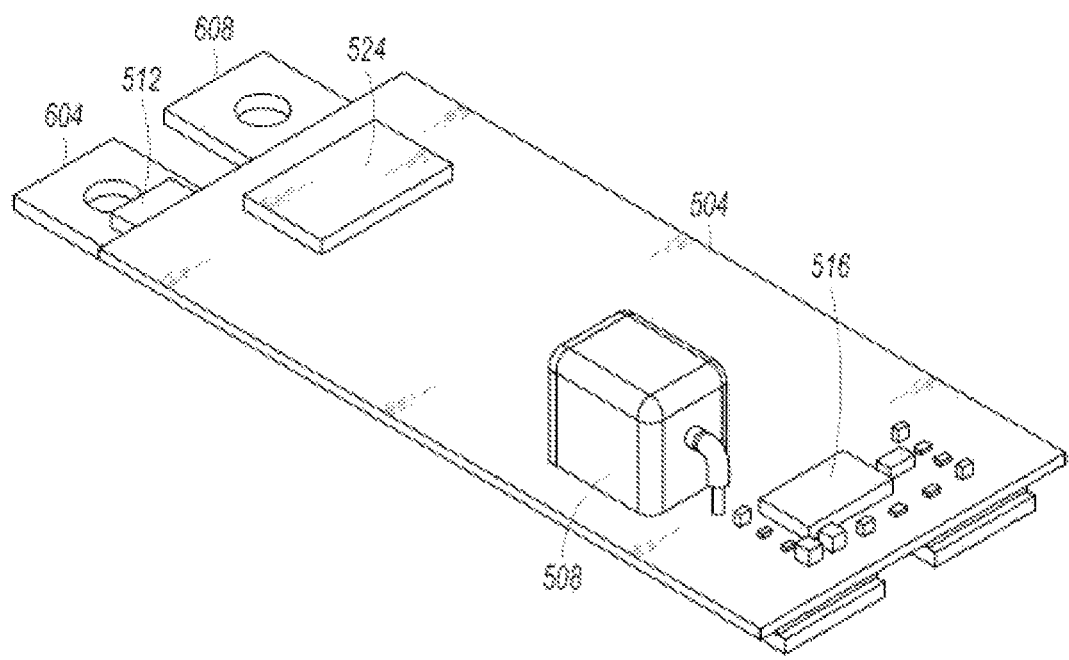
FIGS. 6-8 are perspective views of an example PCB based solid state bidirectional switch.
Figure 7:
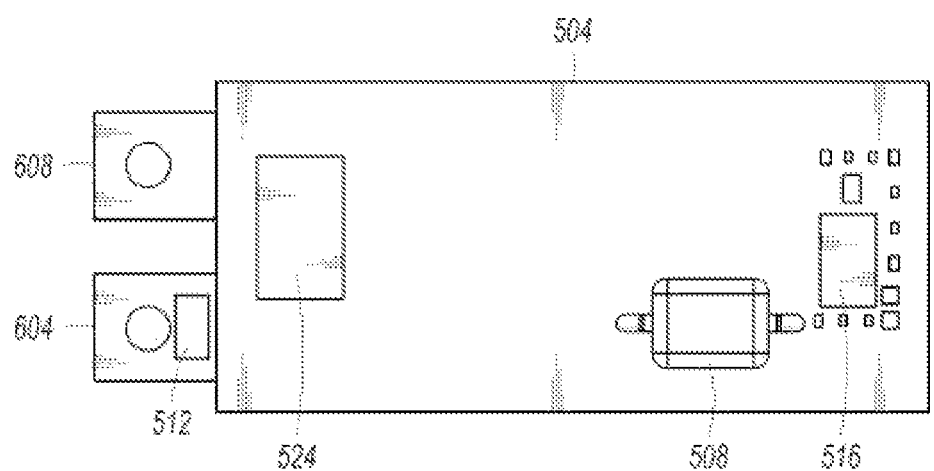
Figure 8:
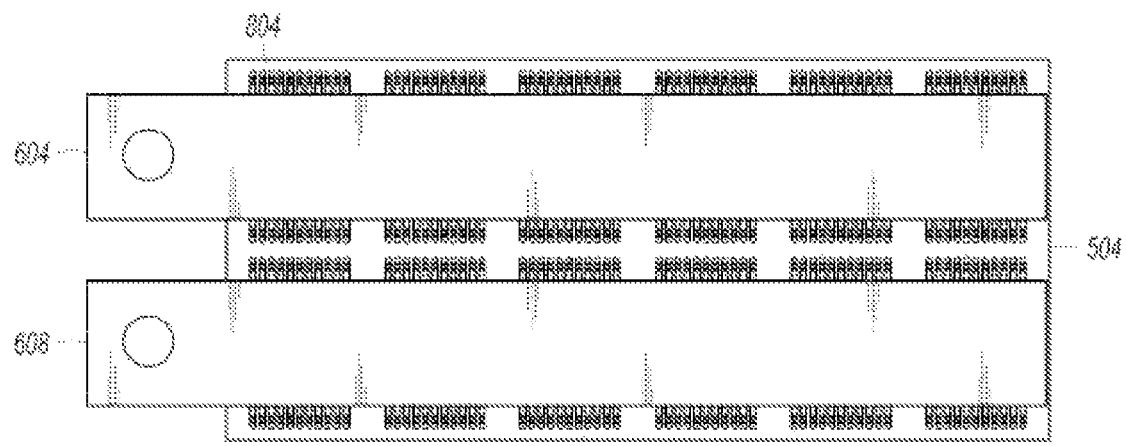

FIG. 6 is a perspective view of a top of an example PCB based solid state bidirectional switch. FIG. 7 is a perspective top view of the example PCB based solid state bidirectional switch. FIG. 8 is a perspective bottom view of the example PCB based solid state bidirectional switch.

As shown in FIGS. 6 and 7, the microcontroller 524, the snubber 508, and the gate driver 516 may be implemented on the top of the PCB 504. Electrically conductive bus bars 604 and 608 are configured to be connected to the high and low sides 304 and 308, respectively. The bus bars 604 and 608 may be made of, for example, copper, aluminum, or another suitable electrically conductive material. In various implementations, the bus bars 604 and 608 may include electrical conductors on PCBs. The current sensor 512 may be implemented as shown or in another location, such as between the switches 501 and 502 or below the switch 502. In various implementations, individual leg current sensors may be omitted, and current through all of the legs may be measured. The bus bars 604 and 608 may also be thermally conductive and act as heat spreaders.

Dies are disposed between the bus bars 604 and 608 and the PCB 504 and include pins (e.g., pin 804) that are electrically connected via the PCB 504. Each die includes a switch (e.g., the switch 316) and an antiparallel diode (e.g., the diode 324). Two of the dies are electrically connected to form a leg and a solid state bidirectional switch. The switches do not include components that physically move. In various implementations, each solid state switch may include multiple dies.

Figure 9:
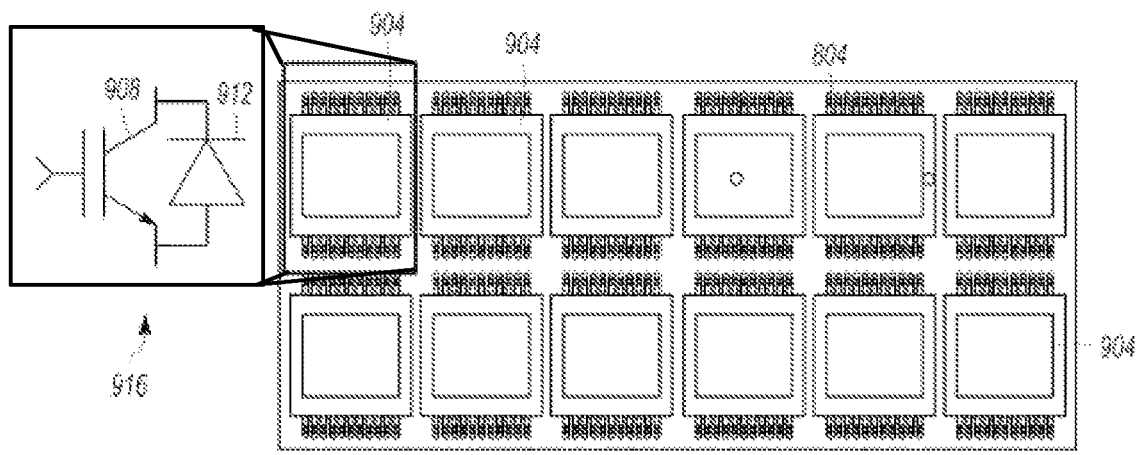
FIG. 9 is an example view of a PCB and six legs of dies.

FIG. 9 is an example view of the PCB 504 and dies 904. As stated above, each of the dies 904 includes a switch (e.g., the switch 316) and an antiparallel diode (e.g., the diode 324). An example switch 908 and antiparallel diode 912 of one of the dies 904 is illustrated at 916. In the example of FIG. 9, 6 pairs of dies are connected in parallel. The dies of a pair are connected in series. A greater or lesser number of dies and legs may be implemented, as described above. A greater number of legs may allow for the use of dies having lower current carrying capabilities.

The switches of the dies 904 are discrete low loss semiconductor switches with predetermined characteristics. The switches may be, for example, insulated gate bipolar transistors (IGBTs), metal oxide semiconductor field effect transistors (MOSFETs), field effect transistors (e.g., junction FETs (J FETs)), silicon superjunction MOSFETs, cascade JFETs, or another suitable type of switch. The switches may be, for example, silicon switches, silicon carbide (SiC) switches, gallium nitride (GaN) switches, diamond switches, or another suitable type of switch. The dies 904 (e.g., centers) are arranged in a predetermined pattern (e.g., linearly or non-linearly) to promote uniform current sharing/flow through each leg. The PCB based solid state bidirectional switch has a fast response (e.g., less than 0.2 milliseconds), has a predetermined blocking voltage (e.g., 600 volts or 1200 volts AC or DC), has high current flow capabilities (e.g., >100 amps). The PCB based solid state bidirectional switch is scalable (e.g., by adding more pairs of dies), is resettable, compact, and does not have any moving parts. The PCB based solid state bidirectional switch has sensing as discussed herein and an onboard control module. The control module implements switch protection, precharging, and overcurrent protection. The PCB based solid state bidirectional switch has a low voltage drop (e.g., less than 1 volt). Use of the PCB allows for scalability and decreases cost. The PCB based solid state bidirectional switch allows for the elimination of a housing, connectors, wiring, etc. as compared to solid state relay power modules and other types of switches.

Figure 10:
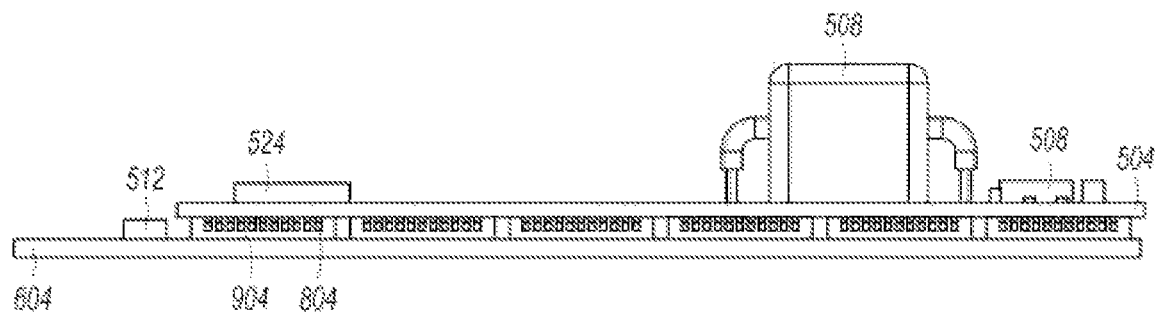
FIG. 10 is a perspective view of the example PCB based solid state bidirectional switch.

FIG. 10 is a side view of an example implementation of the example PCB based solid state bidirectional switch. As shown, the dies 904 are disposed between the PCB 504 and the bus bars, such as the bus bar 604.

Figure 11:
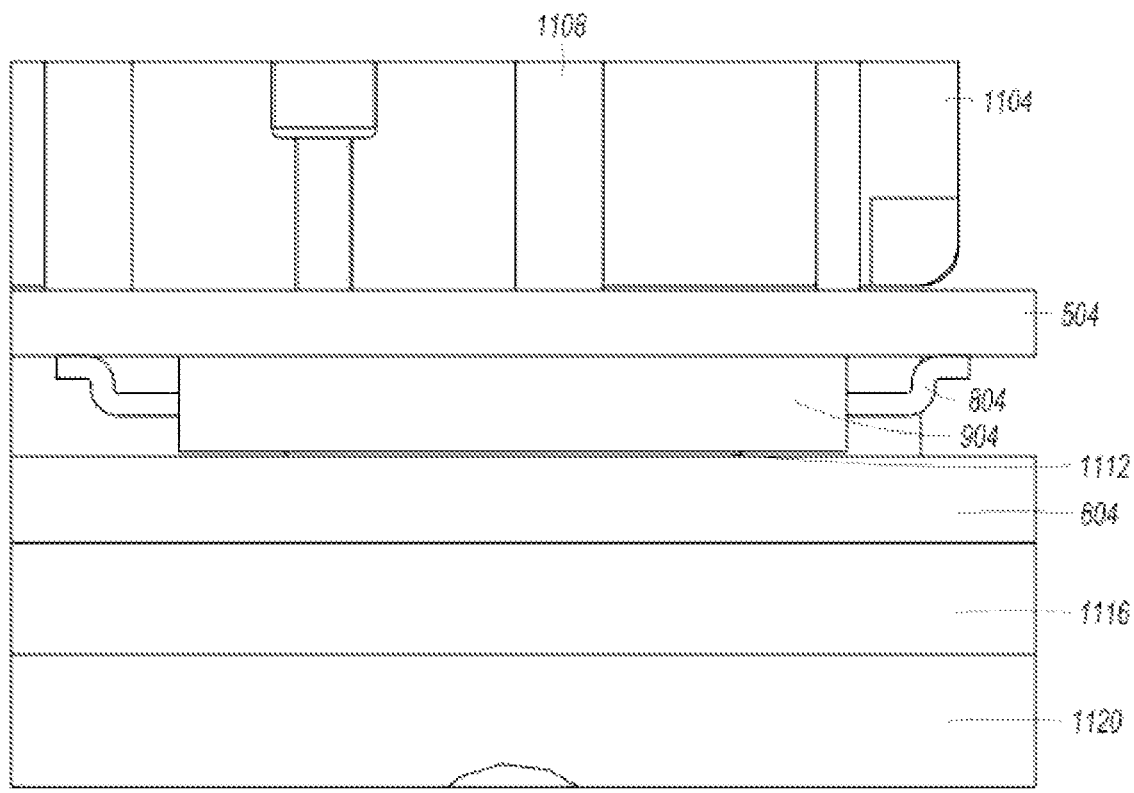
FIG. 11 is a cross-sectional view of the example PCB based solid state bidirectional switch.
Figure 12:
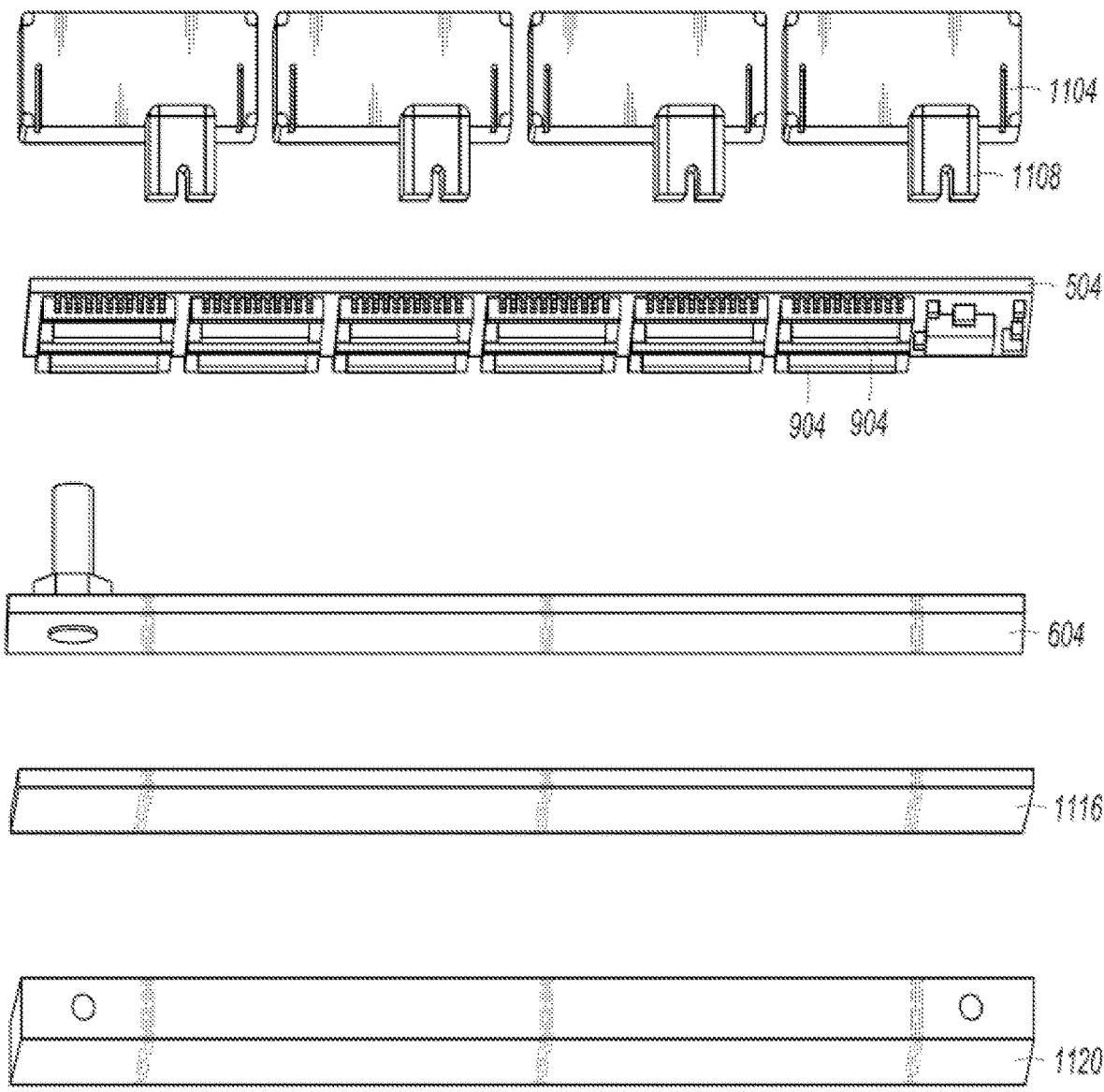
FIG. 12 is an exploded view of the example PCB based solid state bidirectional switch.

FIG. 11 is a close up cross-sectional view of a portion of the example PCB based solid state bidirectional switch. 1104 includes a capacitor of the snubber 508. 1108 includes a diode. Sintering material 1112, such as silver sintering, may be disposed between the die 904 and the bus bar 604. A thermal separator 1116 may be disposed between a heat sink 1120 and the bus bar 604. A total height of the PCB based solid state bidirectional switch may be approximately 25 millimeters or less.

The dies 904 (e.g., centers) may be arranged in two lines (i.e., linearly) as illustrated in FIGS. 8-12. First ones of the dies 904 are arranged in a first line, and second ones of the dies 904 are arranged in a second line. The electrical connections between the dies 904 may be formed on the PCB 504 and all of the dies 904 may be arranged on the PCB 504, such as in the examples of FIGS. 8-12.

Figure 13A:
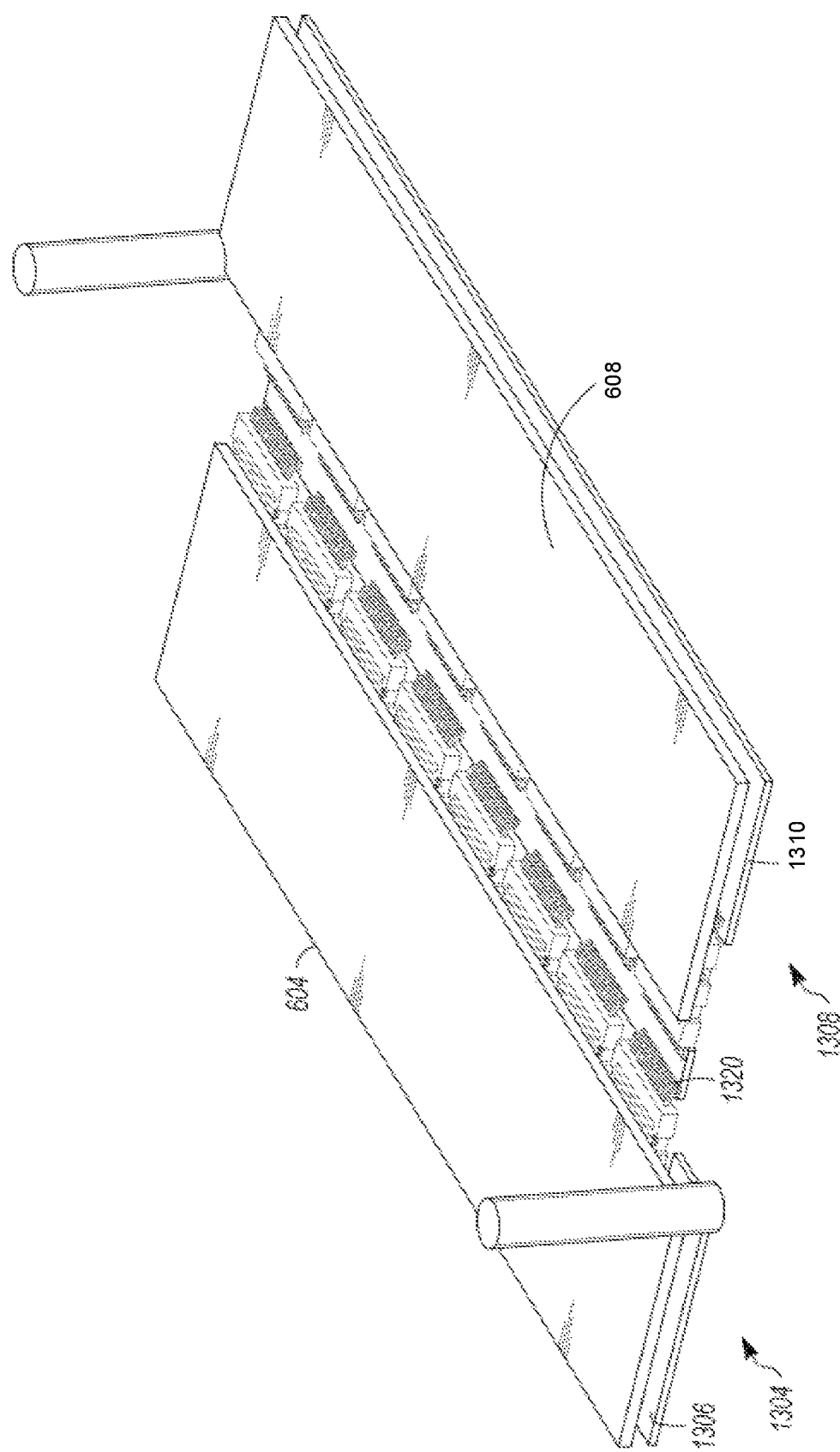
FIGS. 13A-B include perspective views of the example PCB based solid state bidirectional switch including a continuous bus bar.
Figure 13B:
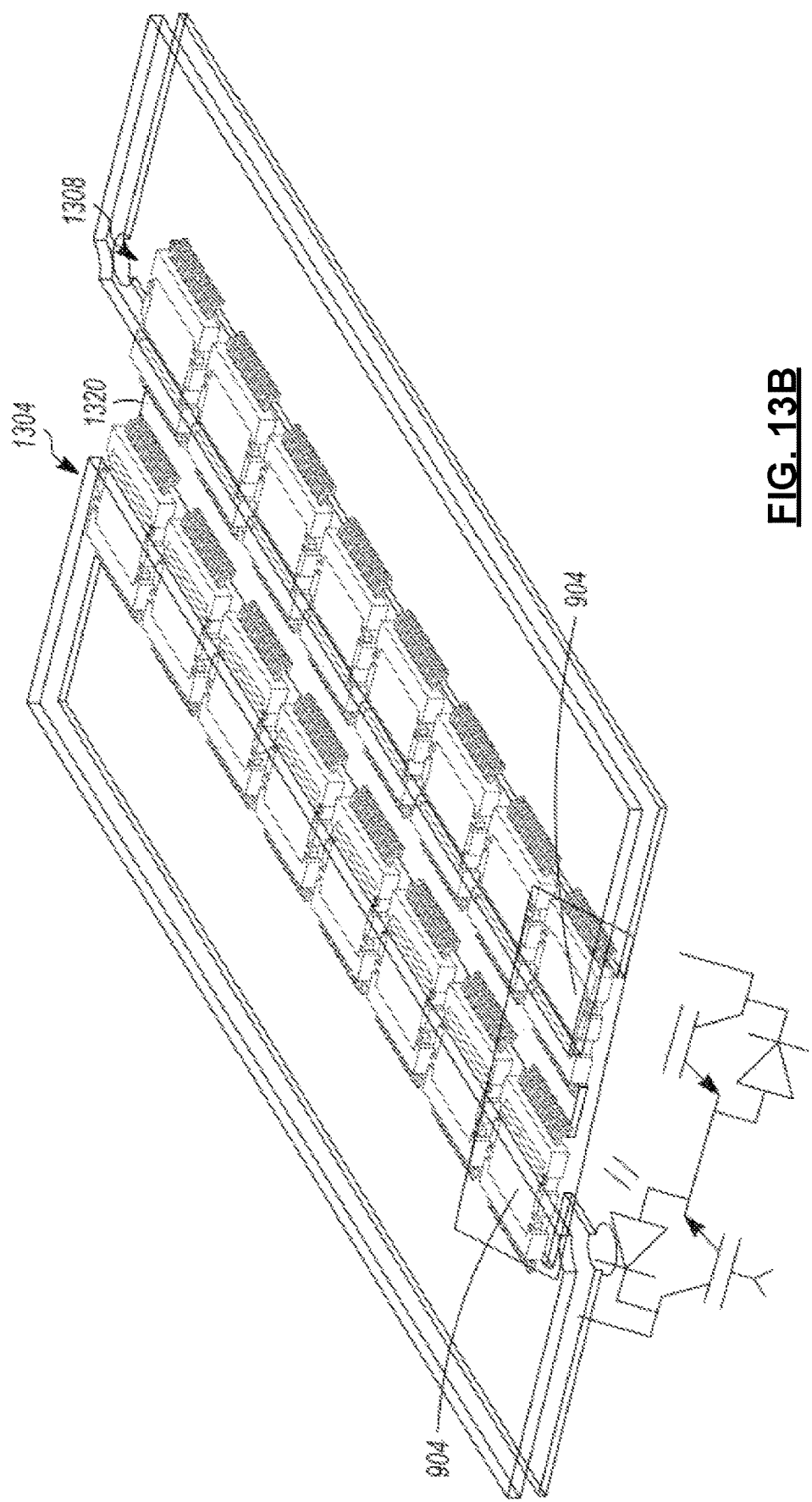

Alternatively, first ones of the dies 904 may be arranged on a first PCB and second ones of the dies 904 may be arranged on a second PCB. FIGS. 13A-13B are an example perspective views where first ones 1304 of the dies 904 are arranged on a first PCB 1306 and second ones 1308 of the dies 904 are arranged on a second PCB 1310. In FIG. 13A, the second PCB 1306 is located below/behind the bus bar 604. The bus bar 608 is located below/behind the second PCB 1310. The bus bars 604 and 608 and the first and second PCBs 1306 and 1310 are shown in phantom on the right of FIG. 13B.

In the example of FIGS. 13A-B, the dies 904 are connected to each other via a bus bar 1320. The bus bar 1320 may be made of, for example, copper, aluminum, or another suitable type of electrically conductive material. In various implementations, the bus bar 1320 may be implemented on a PCB. The bus bar 1320 may be non-segmented, such as in the example of FIGS. 13A-B. In other words, all of the dies 904 may be electrically connected via the same one bus bar 1320.

Figure 14:
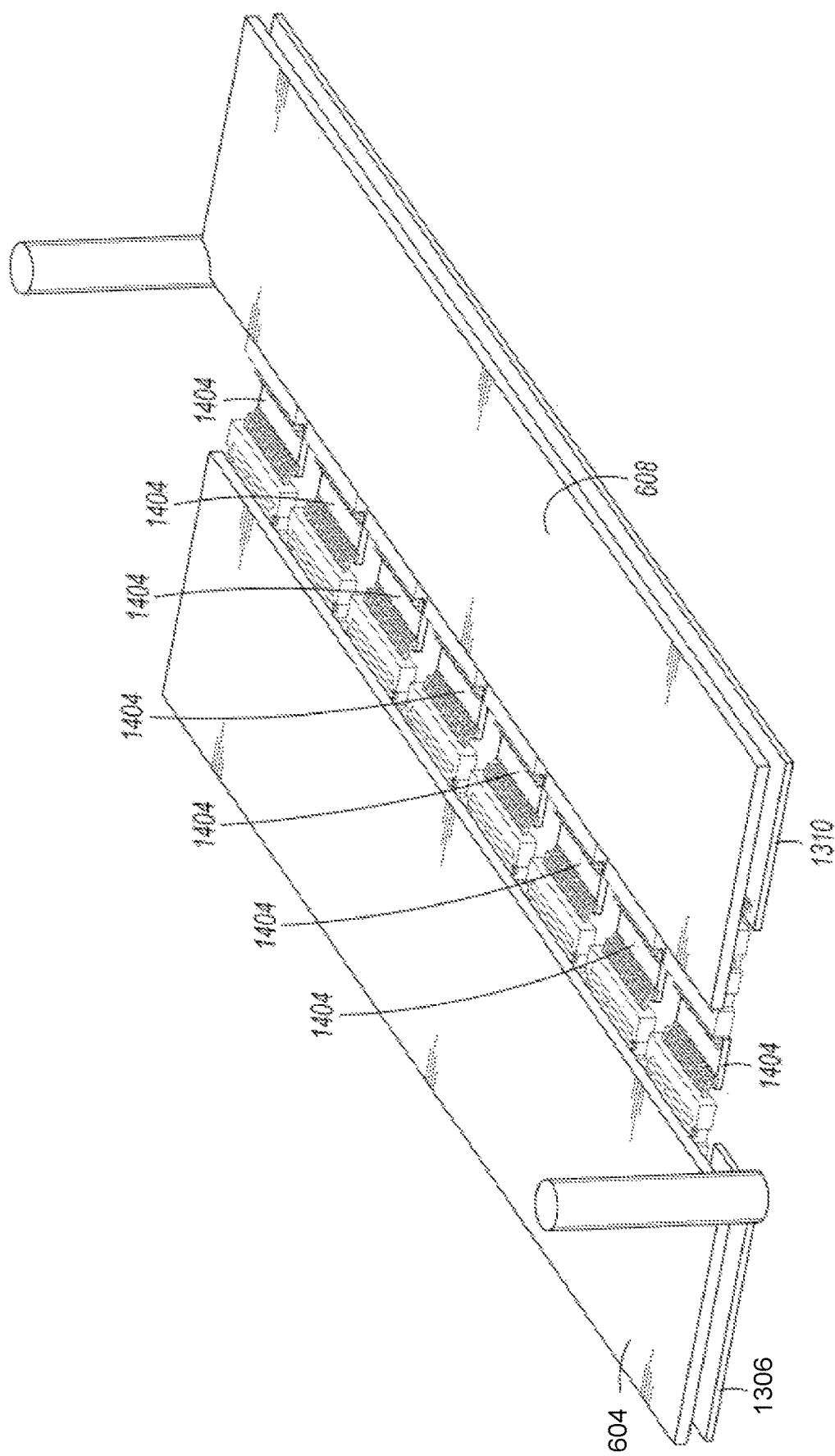
FIGS. 14-17 include perspective views of the example PCB based solid state bidirectional switch including a segmented bus bar.
Figure 15:
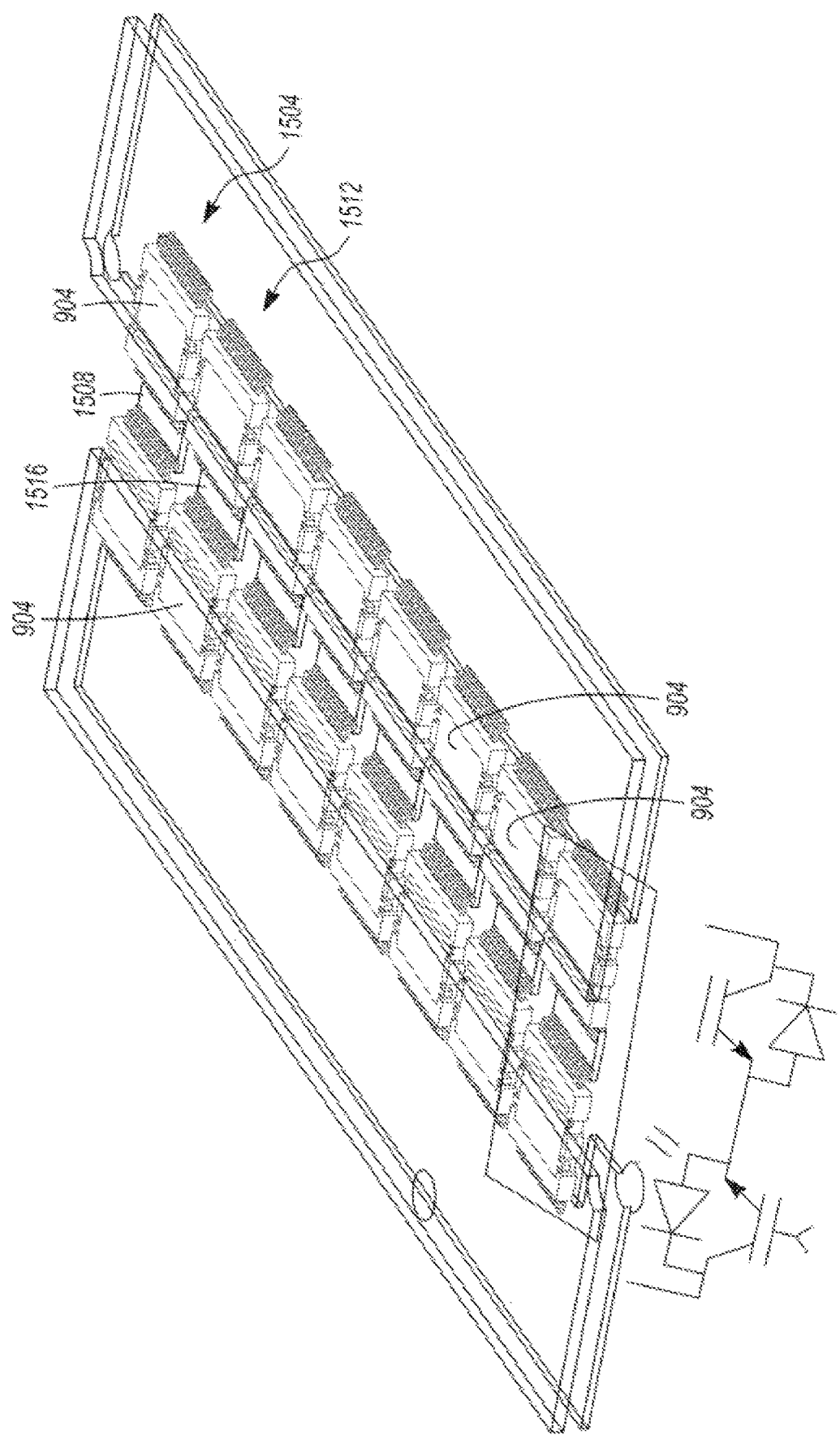

Alternatively, the pairs of dies 904 may be electrically connected via different bus bar segments. FIG. 14 includes a perspective view of the example PCB based solid state bidirectional switch. FIG. 15 includes a perspective view of the example of FIG. 14 with the bus bars 604 and 608 and the first and second PCBs 1306 and 1310 shown in phantom. Pairs of the dies 904 are electrically connected via different bus bar segments 1404 in the examples of FIGS. 14 and 15. For example, the dies 904 of a first pair 1504 are electrically connected via a first bus bar segment 1508, and the dies 904 of a second pair 1512 are electrically connected via a second bus bar segment 1516, and so on. Use of the bus bar segments 1404 may make current distribution more even/equal across the pairs of switches. Current distribution with a single bus bar (e.g., as in the example of FIG. 13) may be less even.

Figure 16:
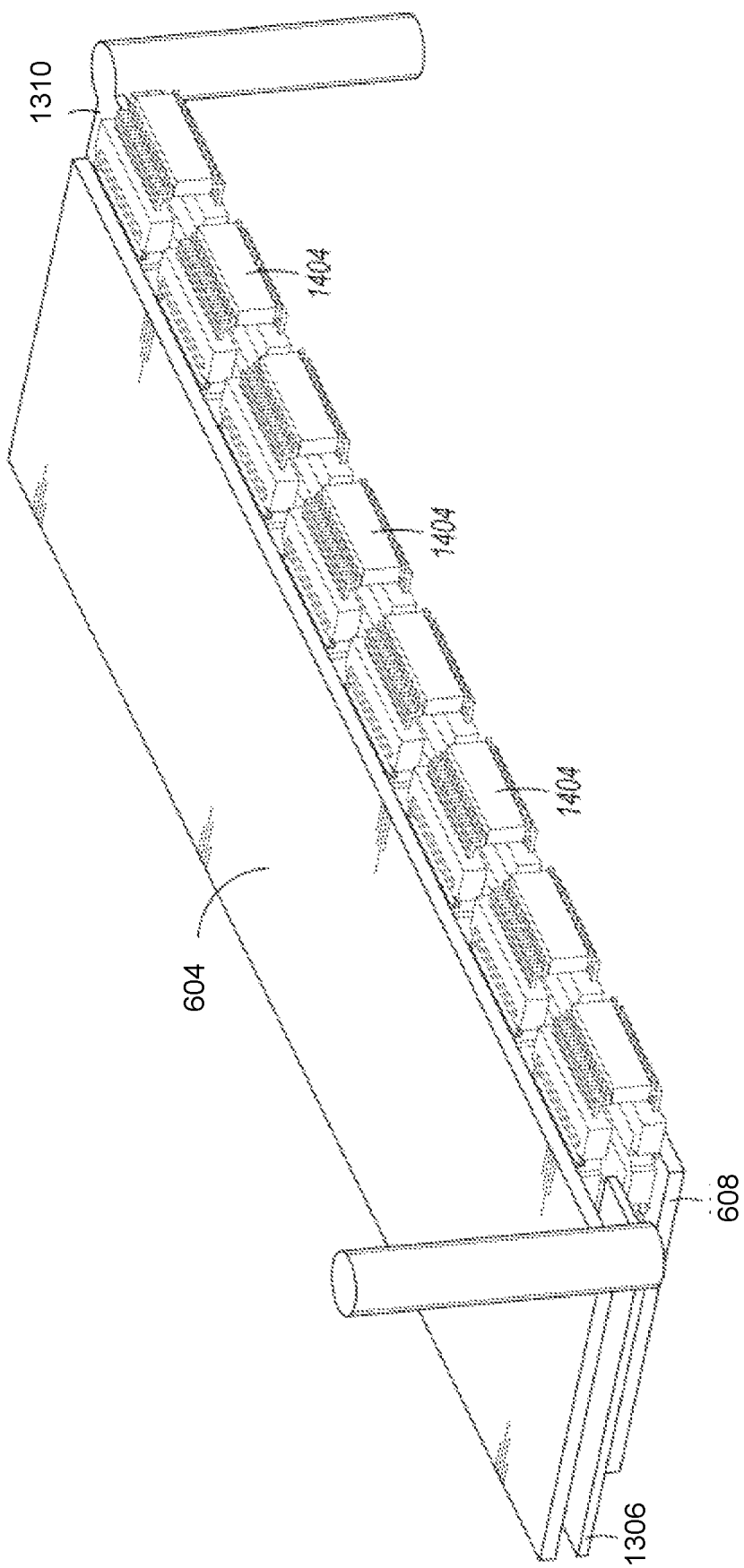
Figure 17:
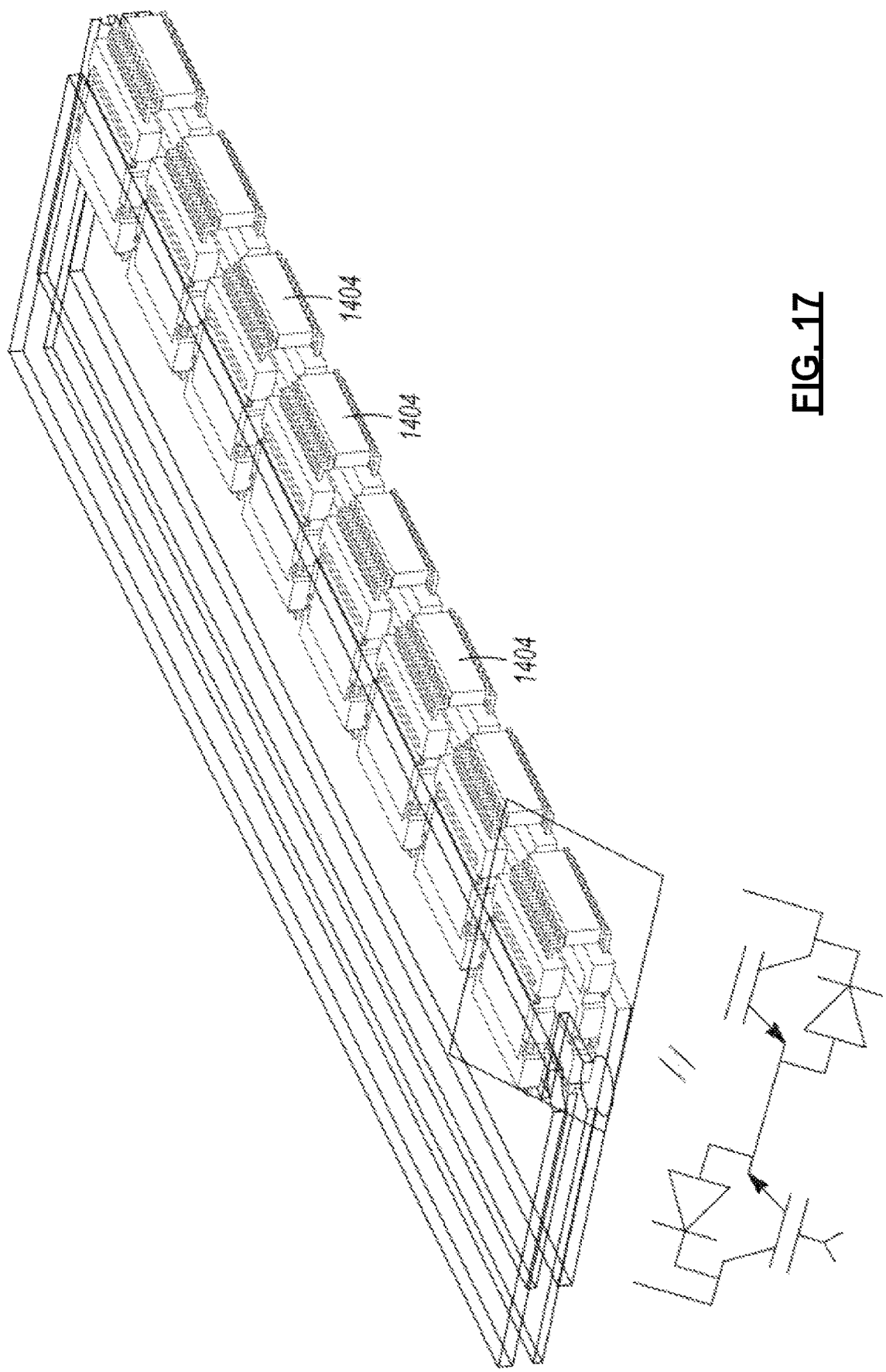

By electrically connecting the dies 904 via one or more bus bars, folding can be performed, and the dies can be arranged on top of each other. FIGS. 16 and 17 include example perspective views of the example PCB based solid state bidirectional switch wherein the first PCB 1306 is disposed between the bus bar 604 and the second PCB 1310, and the second PCB 1310 is disposed between the first PCB 1306 and the second bus bar 608. The bus bars 604 and 608 and the first and second PCBs 1306 and 1310 shown in phantom.

Figure 18:
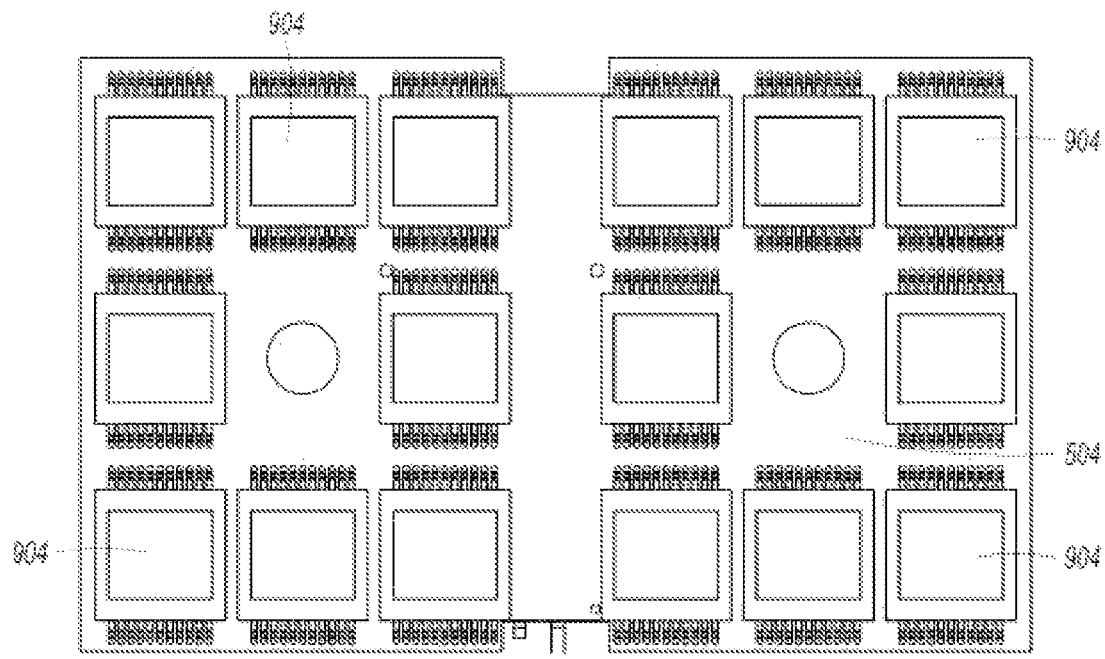
FIGS. 18-25 include perspective views of the example PCB based solid state bidirectional switch with dies arranged in nonlinear arrangements.
Figure 19:
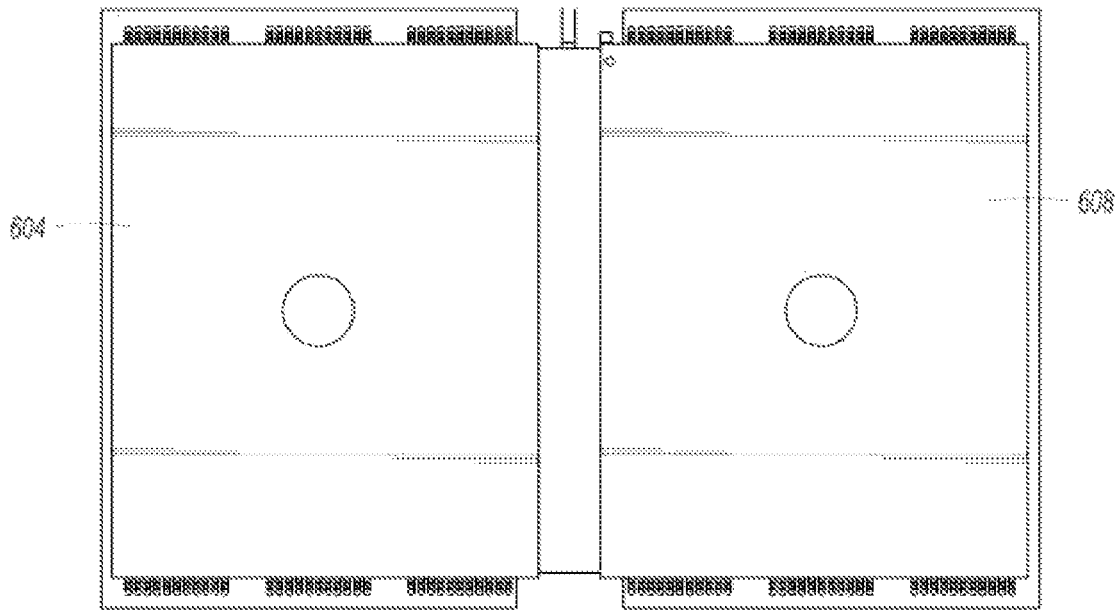
Figure 20:
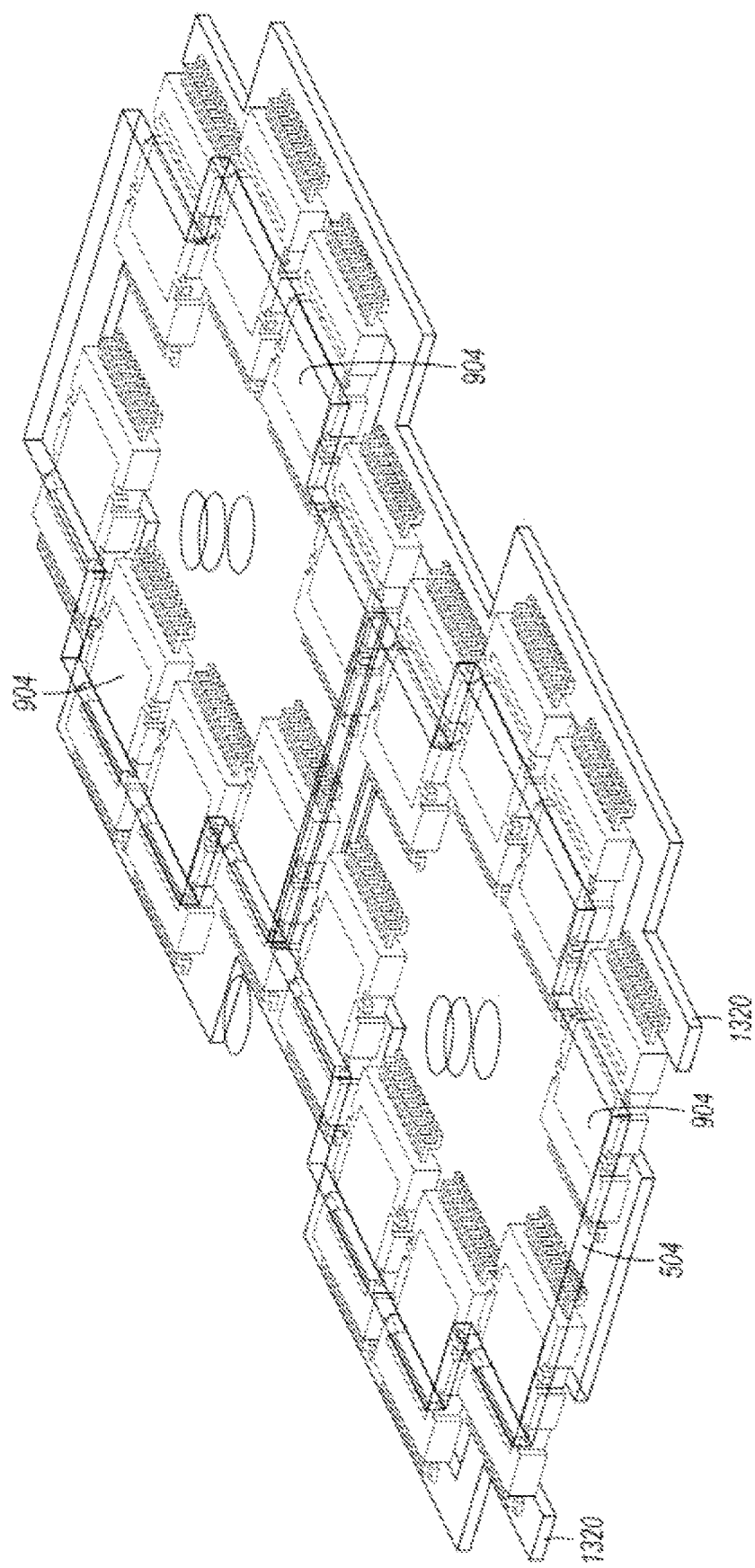
Figure 21:
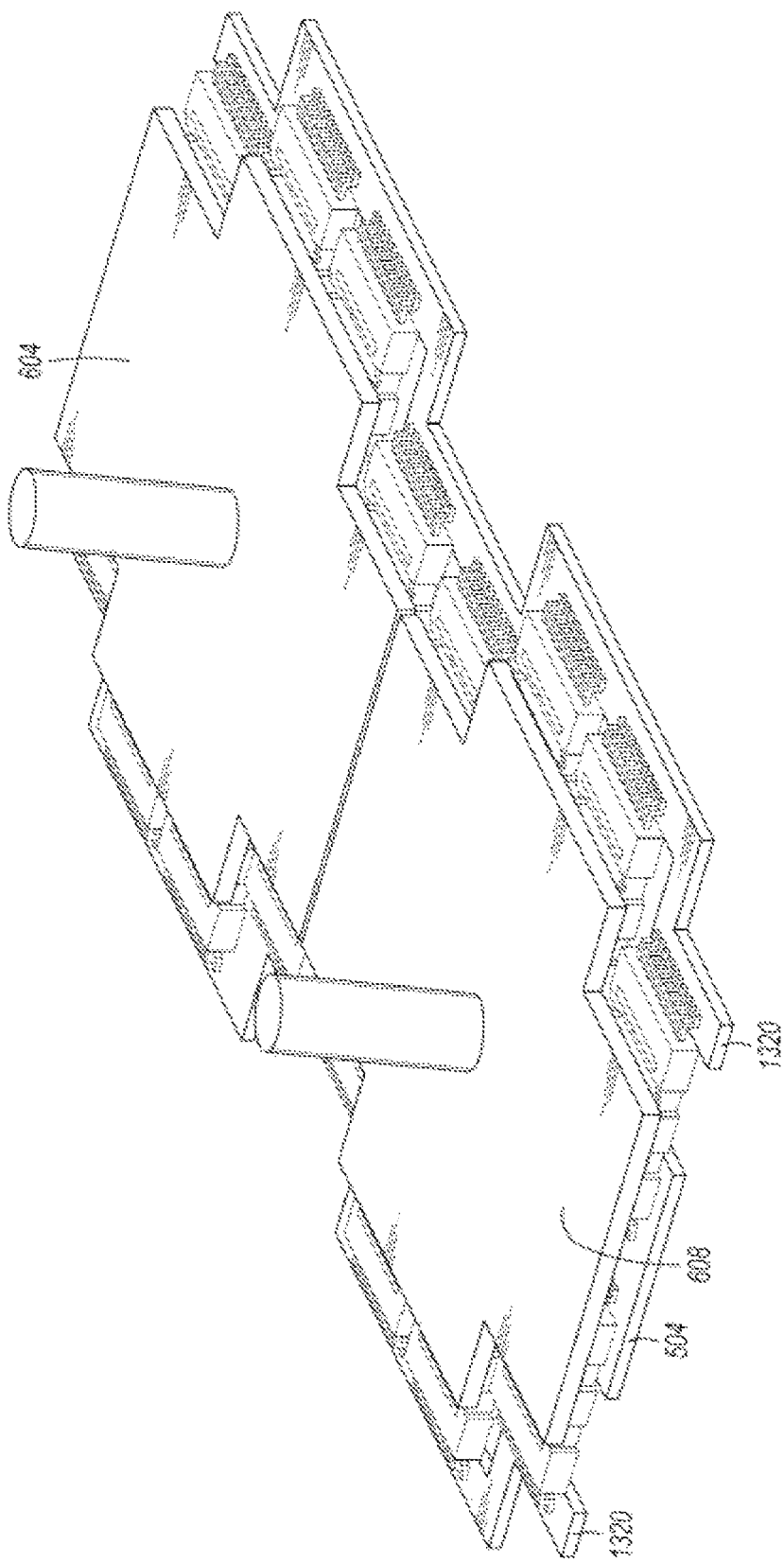

In various implementations, the dies 904 may be arranged non-linearly in a non-linear pattern. FIG. 18 includes an example top view of the PCB based solid state bidirectional switch with the dies 904 arranged in a circular arrangement on the PCB 504. The bus bars 604 and 608 are omitted in the example of FIG. 18. FIG. 19 includes an example top view of the PCB based solid state bidirectional switch of FIG. 18 including the bus bars 604 and 608. The dies 904 may be arranged non-linearly on one PCB or two PCBs, such as in the examples above. FIGS. 20 and 21 include another example non-linear arrangement of the dies 904. The bus bars 604 and 608 are not shown in FIG. 20.

Figure 22:
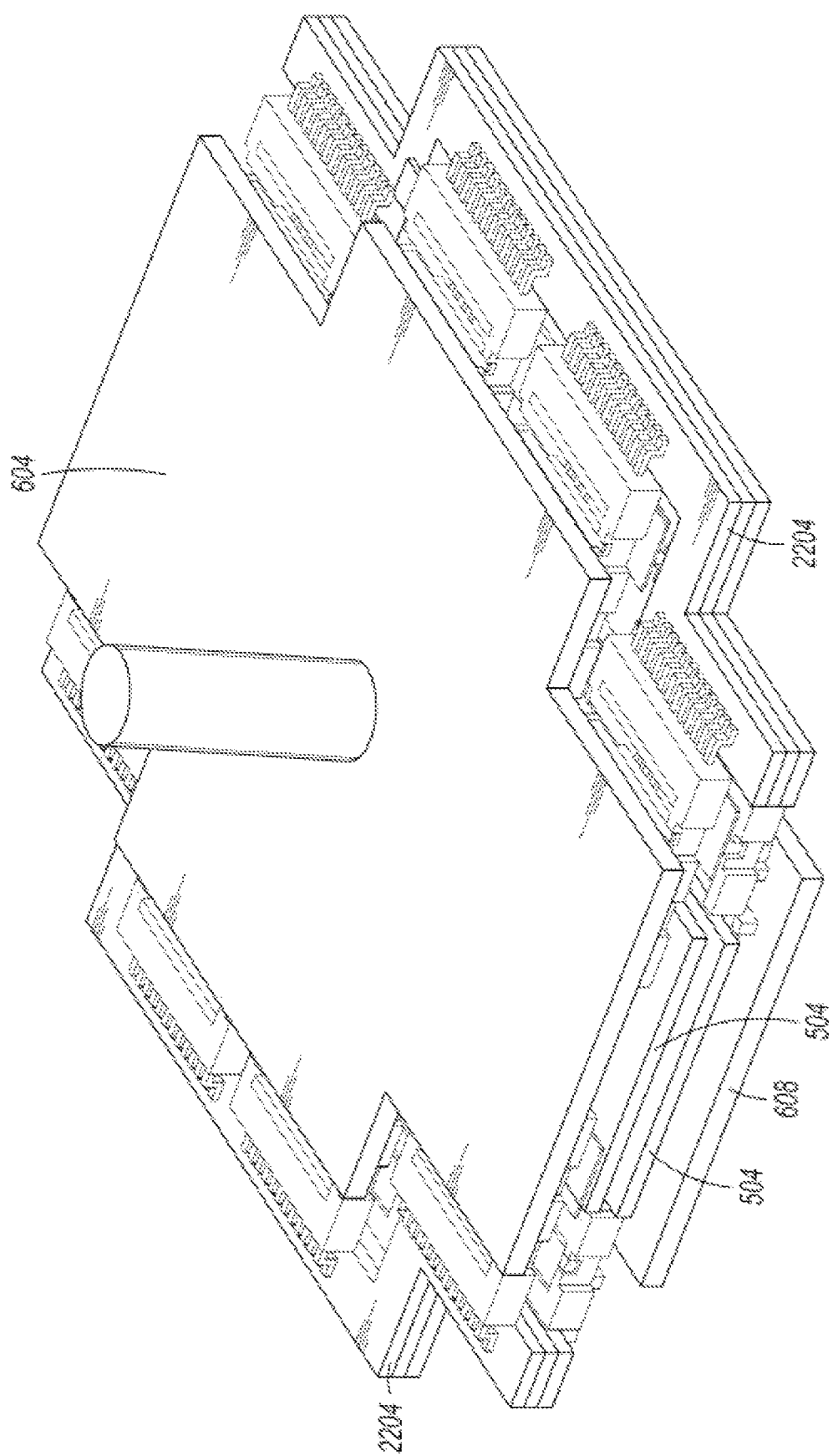
Figure 23:
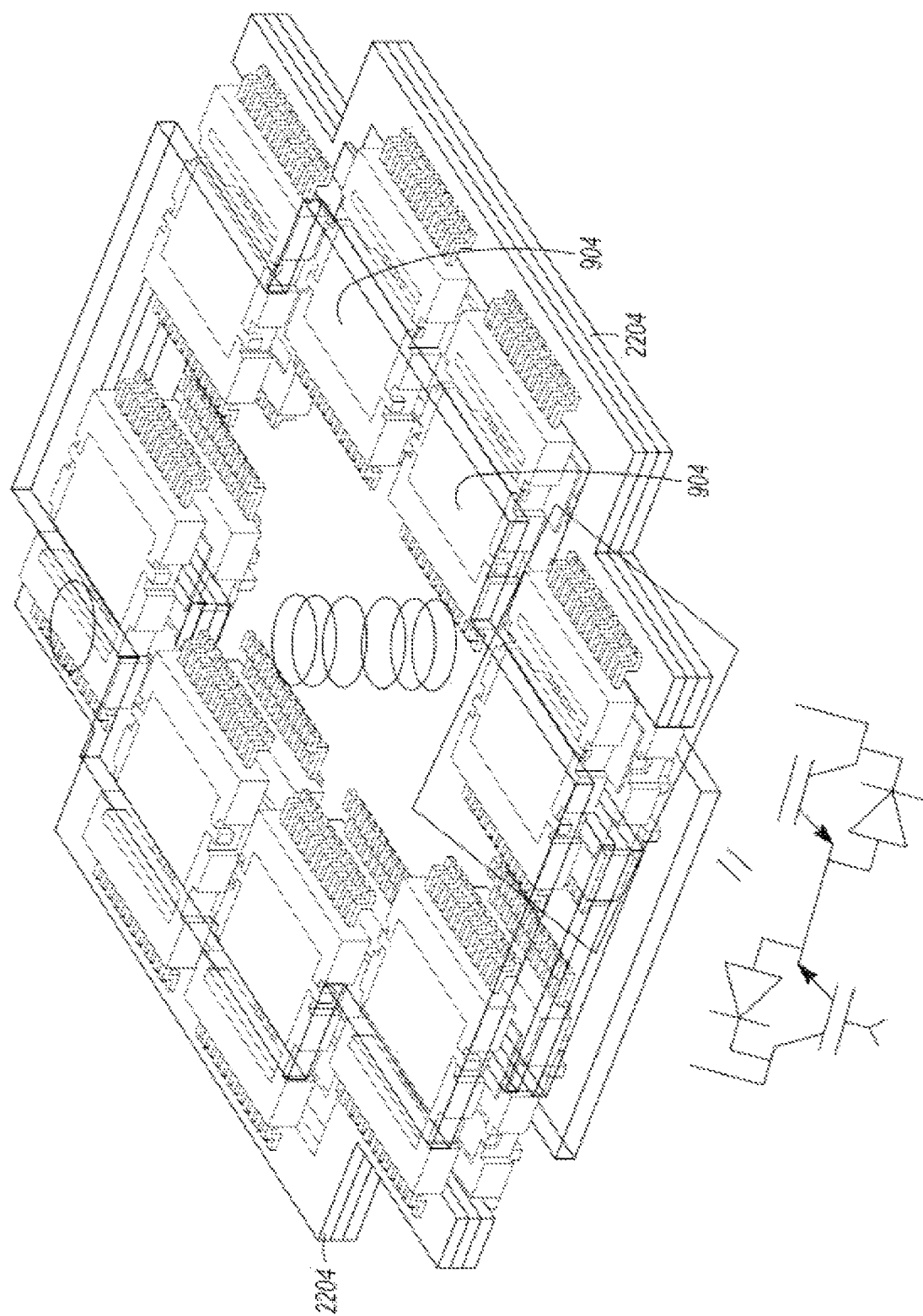
Figure 24:
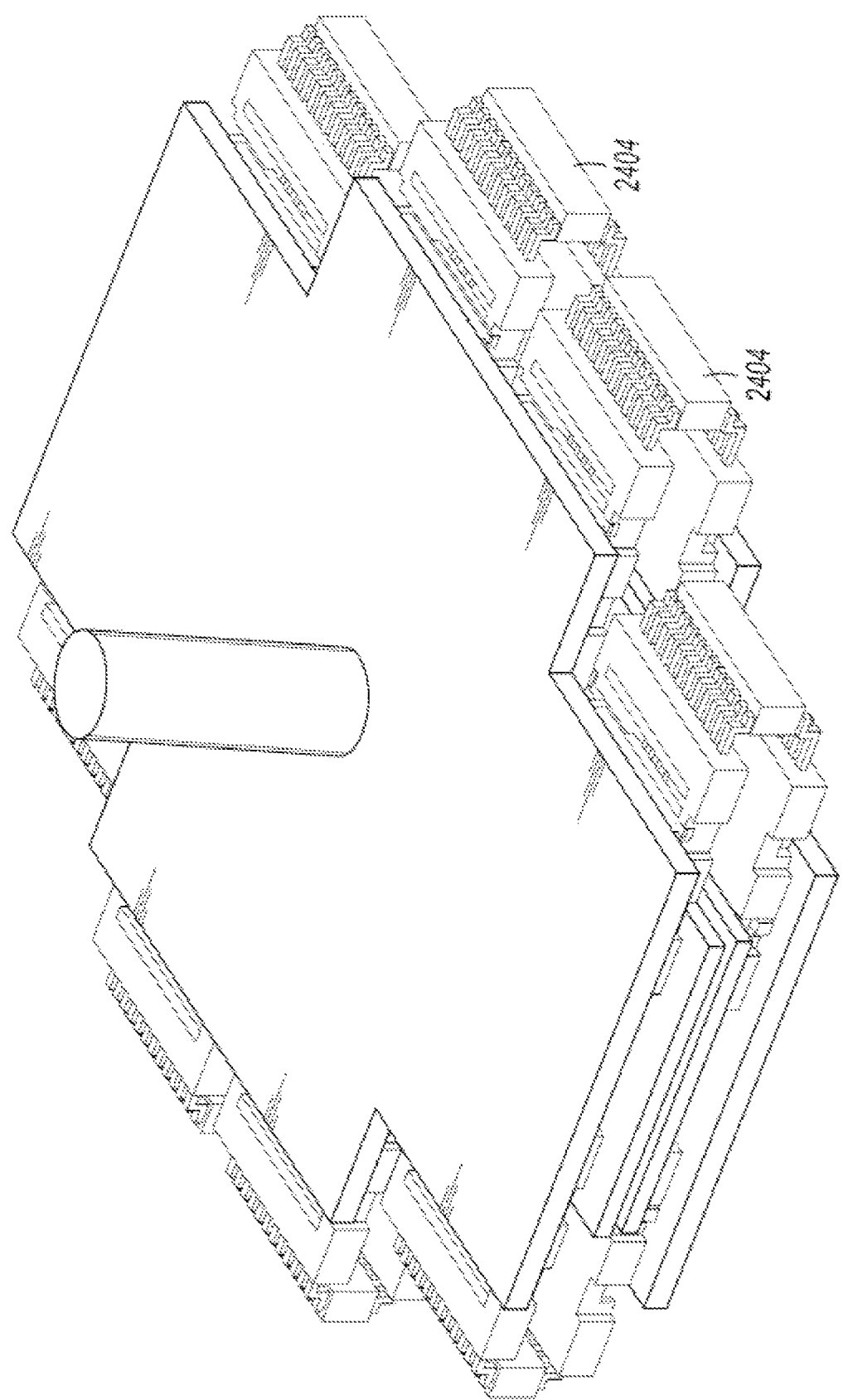
Figure 25:
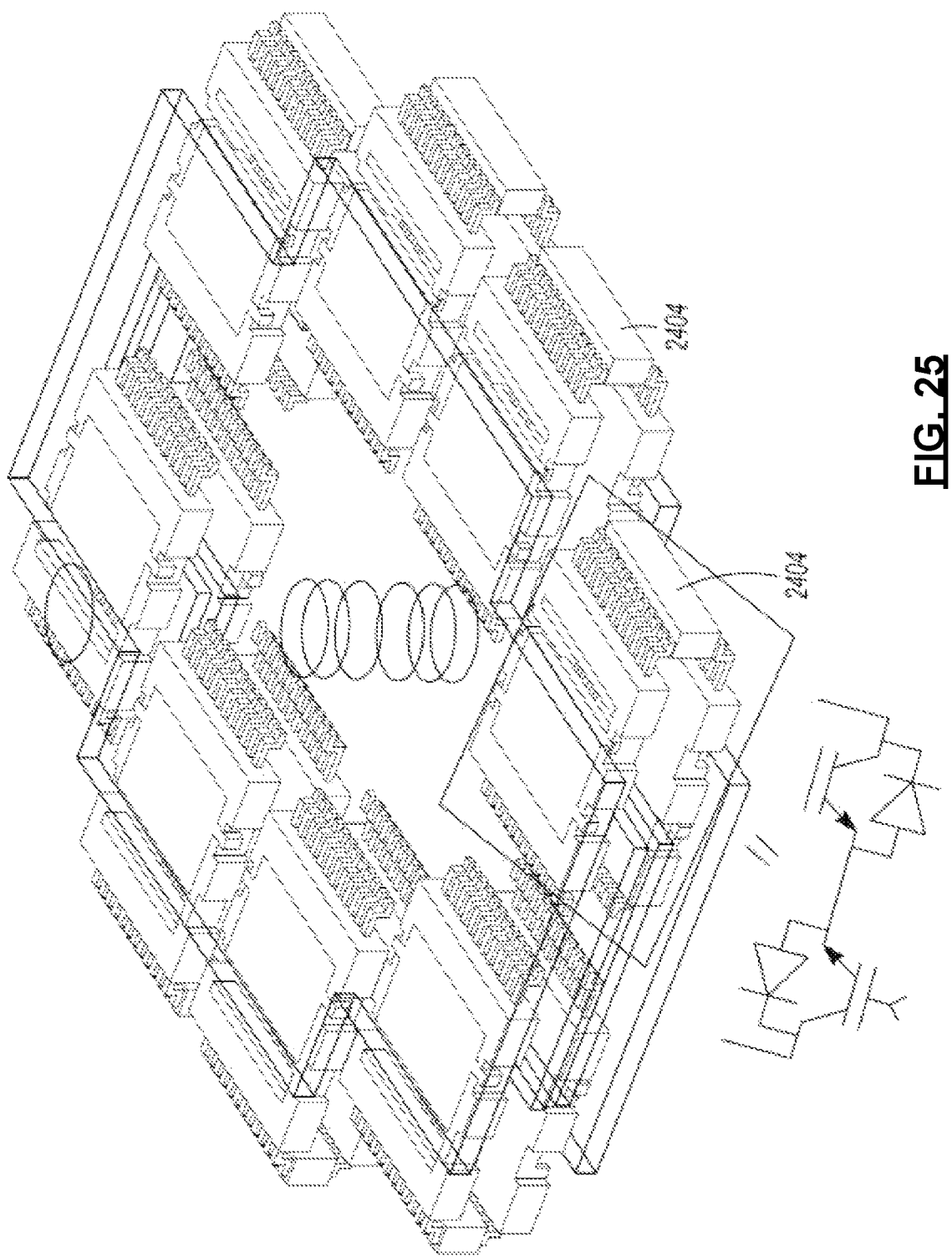

FIGS. 22-24 include example perspective views of an example non-linear arrangement of the dies 904. FIGS. 20 and 21 illustrate a single sided example. FIGS. 22-25 illustrate a double sided example. FIGS. 22 and 23 include continuous bus bars 2204. FIGS. 24 and 25 illustrate segmented bus bars 2404.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP:

Hypertext Preprocessor), Scala, Eiffel, Smalltalk, Erlang, Ruby, Flash®, Visual Basic®, Lua, MATLAB, SIMULINK, and Python®.

What is claimed is:

1. A bi-directional solid state switch, comprising:
a first bus bar;
a second bus bar;
a first solid state switch implemented on a first printed circuit board (PCB), the first solid state switch including:
a first control terminal;
a first terminal electrically connected to the first bus bar; and
a second terminal;
a second solid state switch implemented on a second PCB, the second solid state switch including:
a second control terminal;
a third terminal electrically connected to the second terminal of the first solid state switch; and
a fourth terminal electrically connected to the second bus bar; and
a third bus bar that directly electrically connects the third terminal of the second solid state switch to the second terminal of the first solid state switch;
a third solid state switch implemented on the first PCB, the third solid state switch including:
a third control terminal;
a fifth terminal electrically connected to the first bus bar; and
a sixth terminal; and
a fourth solid state switch implemented on the second PCB, the fourth solid state switch including:
a fourth control terminal;
a seventh terminal electrically connected to the sixth terminal of the second solid state switch; and
an eighth terminal electrically connected to the second bus bar,
wherein the third bus bar further directly electrically connects the seventh terminal of the fourth solid state switch to the sixth terminal of the third solid state switch,
wherein the third bus bar includes a first segment and a second segment that is separate from the second segment,
wherein the third terminal is electrically connected to the second terminal via the first segment, and
wherein the seventh terminal is electrically connected to the sixth terminal via the second segment.

2. The PCB based bi-directional solid state switch of claim 1 wherein the first PCB and the second PCB are the both part of one PCB.

3. The PCB based bi-directional solid state switch of claim 1 wherein the first and second PCBs are different PCBs.

4. The PCB based bi-directional solid state switch of claim 1 wherein:
the first solid state switch is disposed between the first PCB and the first bus bar; and
the second solid state switch is disposed between the second PCB and the second bus bar.

5. The PCB based bi-directional solid state switch of claim 1 further comprising a driver configured to apply signals to the first and second control terminals and implemented on a third PCB.

6. The PCB based bi-directional solid state switch of claim 1 further comprising:
a first diode connected antiparallel to the first solid state switch and implemented on the first PCB; and
a second diode connected antiparallel to the second solid state switch and implemented on the second PCB.

7. The PCB based bi-directional solid state switch of claim 1 further comprising a snubber with a first end electrically connected to the first terminal of the first solid state switch and a second end electrically connected to the fourth terminal of the second solid state switch.

8. The PCB based bi-directional solid state switch of claim 1 further comprising a current sensor on the first bus bar.

9. The PCB based bi-directional solid state switch of claim 1 wherein the first and second solid state switches are field effect transistors.

10. The PCB based bi-directional solid state switch of claim 1 further comprising a control module configured to:
open the second solid state switch when the first solid state switch is closed; and
open the first solid state switch when the second solid state switch is closed.

11. The PCB based bi-directional solid state switch of claim 1 wherein the first and second solid state switches are insulated gate bipolar transistors.

12. The PCB based bi-directional solid state switch of claim 1 wherein the first and second solid state switches are metal oxide semiconductor field effect transistors.

13. The PCB based bi-directional solid state switch of claim 1 wherein the first and second solid state switches are electrically connected via one PCB.

14. The PCB based bi-directional solid state switch of claim 2 wherein the first and second solid state switches are electrically connected via the one PCB.

15. The PCB based bi-directional solid state switch of claim 4 wherein the first PCB is disposed between the first bus bar and the second PCB.

16. The PCB based bi-directional solid state switch of claim 7 wherein the snubber includes a resistor and a capacitor.

17. The PCB based bi-directional solid state switch of claim 9 wherein the first and second solid state switches are insulated gate bipolar transistors.

18. The PCB based bi-directional solid state switch of claim 9 wherein the first and second solid state switches are metal oxide semiconductor field effect transistors.

19. The PCB based bi-directional solid state switch of claim 15 wherein the second PCB is disposed between the first PCB and the second bus bar.

* * * * *